(12) United States Patent
Borisavljevic

(10) Patent No.: US 7,515,072 B2
(45) Date of Patent: Apr. 7, 2009

(54) METHOD AND APPARATUS FOR CONVERTING PCM TO PWM

(75) Inventor: Ana Borisavljevic, Marina Del Rey, CA (US)

(73) Assignee: International Rectifier Corporation, El Segundo, CA (US)

( * ) Notice: Subject to any disclaimer, the term of this patent is extended or adjusted under 35 U.S.C. 154(b) by 1022 days.

(21) Appl. No.: 10/945,625

(22) Filed: Sep. 21, 2004

(65) Prior Publication Data

US 2005/0110667 A1    May 26, 2005

Related U.S. Application Data

(60) Provisional application No. 60/506,188, filed on Sep. 25, 2003.

(51) Int. Cl.
  *H03M 5/08*    (2006.01)
(52) U.S. Cl. .................. 341/53; 341/155; 341/142; 341/145
(58) Field of Classification Search .............. 341/53, 341/142, 155, 145
  See application file for complete search history.

(56) References Cited

U.S. PATENT DOCUMENTS

| | | | |
|---|---|---|---|
| 6,430,220 | B1 | 8/2002 | Determan |
| 6,606,044 | B2 * | 8/2003 | Roeckner et al. ............ 341/143 |

FOREIGN PATENT DOCUMENTS

JP    9-214259    8/1997

(Continued)

OTHER PUBLICATIONS

IEEE Spectrum—Mar. 2003—Cover Story—"Digital Audios Final Frontier" pp. 34-41.

(Continued)

*Primary Examiner*—Jean B Jeanglaude
(74) *Attorney, Agent, or Firm*—Ostrolenk, Faber, Gerb & Soffen, LLP

(57) ABSTRACT

A circuit for converting from an input serial pulse code modulated (PCM) digital signal to an output pulse width modulated (PWM) digital signal for driving a switching audio amplifier requiring a pulse width modulated input signal, the circuit comprising a sample rate converter receiving the input serial PCM digital signal at a first sampling frequency and converting the input serial PCM digital signal to a second serial PCM digital signal at a second frequency if the first sampling frequency is lower than the second frequency, a digital filter stage for up-sampling the second serial PCM digital signal to a third frequency and converting the second serial PCM digital signal to a parallel digital signal, a volume control stage receiving the parallel digital signal and generating a volume adjusted parallel digital signal in accordance with a digital volume command control signal, a digital cross-point estimator stage for calculating a cross-point between the volume adjusted parallel digital signal and a digital ramp signal and generating a parallel digital signal representing a desired pulse width modulation of the switching audio amplifier, a quantizing stage for quantizing the parallel digital signal representing the desired pulse width modulation into a quantized parallel digital signal representing the pulse width modulation to be applied to the switching audio amplifier; and a PWM generation stage for converting the quantized parallel digital signal into a PWM signal for driving the switching audio amplifier.

54 Claims, 20 Drawing Sheets

FOREIGN PATENT DOCUMENTS

| JP | 11-261347 | 9/1999 |
| JP | 2000-244257 | 9/2000 |
| JP | 2000-341131 | 12/2000 |
| JP | 2003-510878 | 3/2003 |
| JP | 2003-122396 | 4/2003 |
| JP | 2003-243990 | 8/2003 |
| WO | WO 02/15393 | 2/2002 |
| WO | WO 03/021770 A1 | 3/2003 |
| WO | WO 03/061136 | 7/2003 |

OTHER PUBLICATIONS

"High-Fidelity PWM Inverter for Audio Amplification Based On Real-Time DSP"—Dept of Electrical and Computer Engineering, Jun. 19, 2002, pp. 1-32.

"TMS320C67-Based Design of a Digital Audio Power Amplifier Introducing Novel Feedback Strategy"—Rose-Hulman Institute of Technology, Electrical and Computer Engineering Dept. pp. 1-16.

"High-Fidelity PWM-Based Amplifier Concept for Active Loudspeaker Systems with Very Low Energy Consumption". J. Audio Eng. Soc., vol. 45, No. 7/8 Jul./Aug. 1997, pp. 554-570.

IEEE Transactions On Communications, vol. Com-34, No. 1, Jan. 1986 "Double Interpolation for Digital-to-Analog Conversion" pp. 77-81.

IEEE, vol. 69, pp. 300-331, Mar. 1981 "Interpolation and Decimation of Digital Signals—A Tutorial Review" pp. 417-448.

Oppenheimer, A.V., Schafer, R.W.: "Discrete-Time Signal Processing" (Prentice Hall, 1999) month unknown.

Li, Huiyun et al, "A Novel Pulse Width Modulation Sampling Process for Low Power, Low Distortion Digital Class D Amplifiers," Proc. 43$^{rd}$ IEEE Midwest Symposium on Circuits and Systems, Lansing MI, Aug. 8-11, 2000, pp. 514-517.

Official Notice of Rejection in corresponding Japanese Patent Application No. 2004-280423 mailed Jul. 18, 2008.

* cited by examiner

Divider in cross-point solver block works less than 10% of the time at 100 MHz,
Subtractor works 100% of the time at 100 Mhz

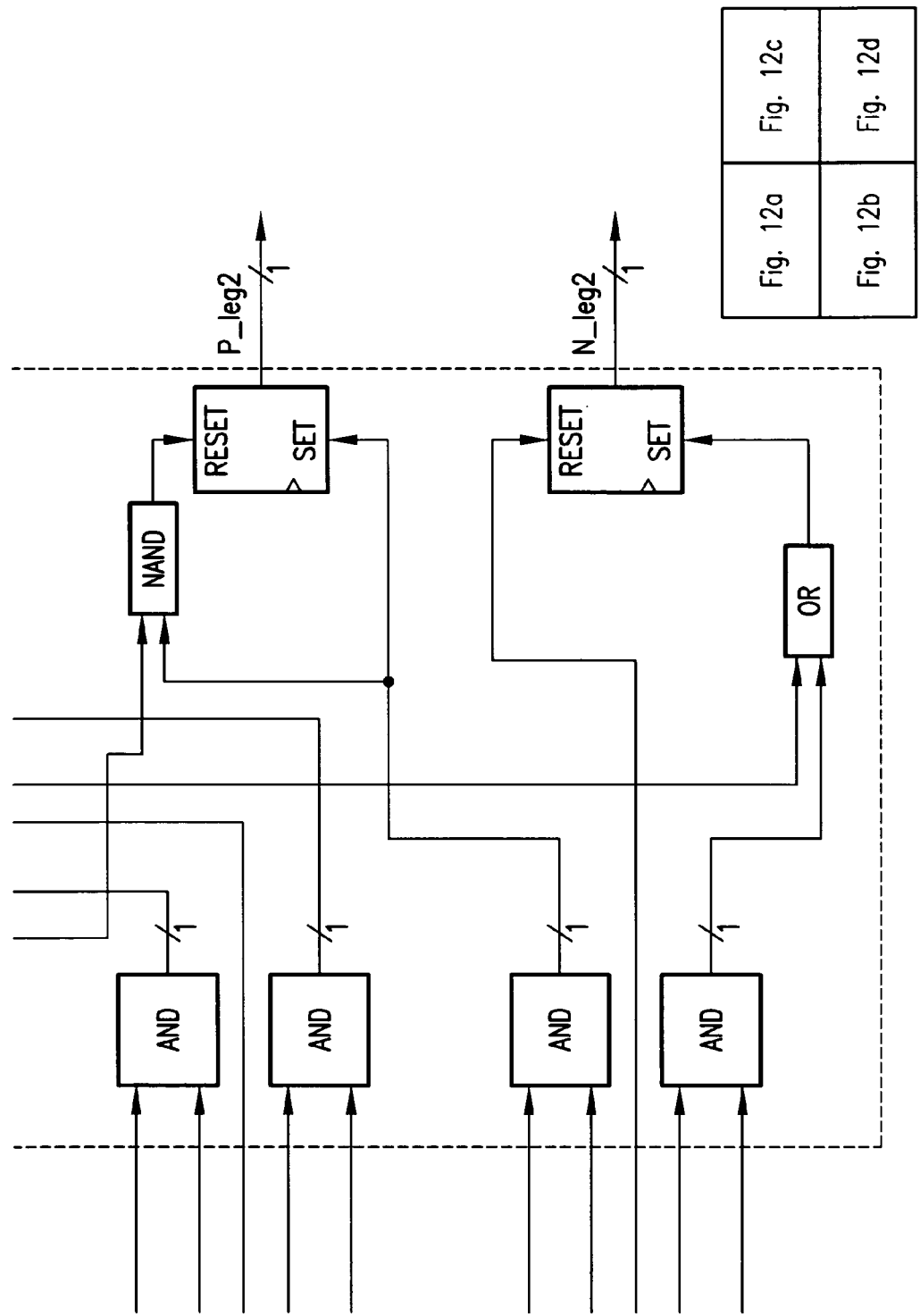

METHOD AND APPARATUS FOR CONVERTING PCM TO PWM

CROSS REFERENCE TO RELATED APPLICATION

This application claims the benefit and priority of U.S. Provisional Patent Applications Ser. No. 60/506,188 filed Sep. 25, 2003 entitled "PCM TO PWM IC", the entire disclosure of which is incorporated herein by reference.

BACKGROUND OF THE INVENTION

The present invention relates to a digital conversion circuit for converting from one form of digital modulation(Pulse Code Modulation) to Pulse Width Modulation. In particular, the invention relates to a digital integrated circuit for the control of switching circuits, and in particular, Class D audio amplifiers. A function of the integrated circuit is to accept a digitally encoded audio signal (in the PCM (Pulse Code Modulation) format) and produce a Pulse Width Modulated (PWM) signal, which is used to control a Class D audio amplifier.

Audio amplifiers are power converters that convert the input DC to a desired output AC signal. This output AC signal is then applied to loudspeakers, which in turn produce the desired sound. In order to obtain a good quality sound reproduction, the audio amplifier is required to have a low total harmonic distortion (THD) of the output AC signal throughout the output power range.

Traditionally, class A,B and AB linear amplifiers have been used as audio amplifiers. Presently, Class D switch-mode amplifiers are increasingly replacing the conventional class A and class B amplifiers because they have the advantages of being more efficient and smaller. Recently, different chips which drive class D audio amplifiers have been released by companies like Tripath Technology, Texas Instruments, and Cirrus Logic in the United States; Philips and STMicroelectronics (partnering with ApogeeDDX) in Europe; and Mitsubishi and Sanyo (partnering with Bang & Olufsen) in Japan. Examples include the Mitsubishi M65817A FP, Crystal CS44210 and Texas Instruments TAS5010 or chips. Class D switch-mode amplifiers include both half-bridge and full-bridge switch-mode converter architectures.

SUMMARY OF THE INVENTION

According to one aspect, the invention comprises a circuit for converting from an input serial pulse code modulated (PCM) digital signal to an output pulse width modulated (PWM) digital signal for driving a switching audio amplifier requiring a pulse width modulated input signal, the circuit comprising a sample rate converter receiving the input serial PCM digital signal at a first sampling frequency and converting the input serial PCM digital signal to a second serial PCM digital signal at a second frequency if the first sampling frequency is lower than the second frequency, a digital filter stage for up-sampling the second serial PCM digital signal to a third frequency and converting the second serial PCM digital signal to a parallel digital signal, a volume control stage receiving the parallel digital signal and generating a volume adjusted parallel digital signal in accordance with a digital volume command control signal, a digital cross-point estimator stage for calculating a cross-point between the volume adjusted parallel digital signal and a digital ramp signal and generating a parallel digital signal representing a desired pulse width modulation of the switching audio amplifier, a quantizing stage for quantizing the parallel digital signal representing the desired pulse width modulation into a quantized parallel digital signal representing the pulse width modulation to be applied to the switching audio amplifier, and a PWM generation stage for converting the quantized parallel digital signal into a PWM signal for driving the switching audio amplifier.

According to another aspect, the invention comprises a circuit for converting from an input serial pulse code modulated (PCM) digital signal to an output pulse width modulated (PWM) digital signal for driving a switching circuit requiring a pulse width modulated input signal, the circuit comprising a digital filter stage for up-sampling the input serial PCM digital signal to a higher frequency and converting the input serial PCM digital signal to a parallel digital signal, a digital cross-point estimator stage for calculating a cross-point between the parallel digital signal and a digital ramp signal and generating a parallel digital signal representing a desired pulse width modulation of the switching circuit, and a PWM generation stage for converting the parallel digital signal, representing the desired pulse width modulation of the switching circuit into a PWM signal for driving the switching circuit.

According to yet another object, the invention comprises a method for converting from an input serial pulse code modulated (PCM) digital signal to an output pulse width modulated (PWM) digital signal for driving a switching circuit requiring a pulse width modulated input signal, the method comprising up-sampling the input serial PCM digital signal to a higher frequency and converting the input serial PCM digital signal to a parallel digital signal, calculating a cross-point between the parallel digital signal and a digital ramp signal and generating a parallel digital signal representing a desired pulse width modulation of the switching circuit, and converting the parallel digital signal, representing the desired pulse width modulation of the switching circuit into a PWM signal for driving the switching circuit.

The circuitry of the present invention preferably has the entire digital signal processing implemented entirely in hardware and features feedback control of the overall output AC signal. The invention may be implemented as an FPGA (Field Programmable Gate Array), works at a very high frequency of, for example, 98.304 MHz and has a resolution of the PWM signal of close to 196.608 MHz. The invention allows for a Total Harmonic Distortion THD+N of the PWM signal of $1.16 \times 10^{-5}$ and a dynamic range of the PWM signal of 98 dB (output is a 3-level PWM signal suitable for driving a full-bridge power amplifier).

Other features and advantages of the present invention will become apparent from the following description of the invention which refers to the accompanying drawings.

BRIEF DESCRIPTION OF THE DRAWING(S)

The invention will now be described in greater detail in the following detailed description with reference to the drawings in which.

DETAILED DESCRIPTION OF THE INVENTION

Figure 1:
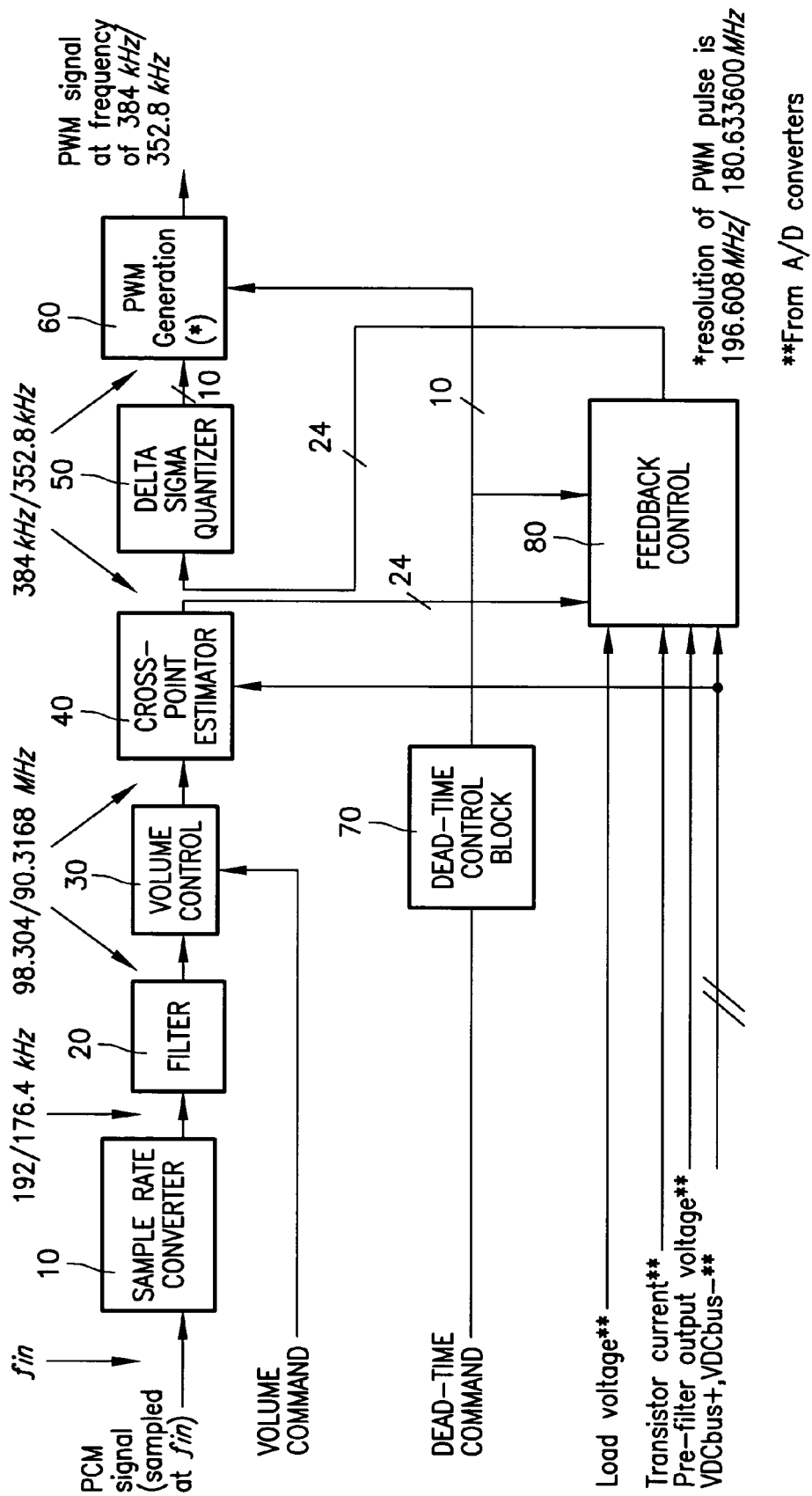
FIG. 1 is an overall block diagram of the circuit for converting PCM to PWM according to the invention.

With reference now to the drawings, a block diagram of the invention is shown in FIG. 1. The input to the chip is a signal at any of the following sampling frequencies $f_{in}$: 48 kHz, 96 kHz, 192 kHz, 44.1 kHz, 88.2 kHz and 176.4 kHz. Input data can be 16-bit, 20-bit or 24-bit input data. The format of the data can be either MSB first or LSB first, left or right justified. Data in IIS format are also accepted. The output signal is a PWM signal at frequency of 768 kHz or 705.6 kHz, depending on the sampling frequency of the input. It is assumed that the sampling frequency of the input is locked in phase with the clock frequency of the chip by circuitry external to the chip.

The basic blocks of the invention are: a) sample rate converter 10, b) filter 20, c) volume control block 30 d) cross-point estimator 40 e) delta sigma quantizer 50, f) PWM generation block 60, g) dead time control block 70 and h) feedback control block 80. Data are preferably represented and processed in two's complement notation.

The sample rate converter 10 and filter 20 reproduce the input signal but upsampled to a very high frequency (of 98.304 MHz/90.3168 MHz). This upsampled signal is further scaled by the volume control block 30. The scaled signal is then compared to a virtual sawtooth "ramp", where the ramp's frequency is at the switching frequency of the power stage. The comparison is done by the cross-point estimator block 40, and the result is a 24-bit word representing the desired pulse width of the output PWM signal. The cross-point estimator block 40 uses a first order (linear) approximation for the input signal to estimate the cross-point of the input signal and the "ramp". It is possible to use a linear approximation for the input signal (instead of the higher order approximation) and still obtain excellent results because the input signal is upsampled to a very high frequency of (of 98.304 MHz/90.3168 MHz). This approach is well-suited to the hardware based implementation of the PCM to PWM function.

This 24-bit word, representing the desired pulse width of the output PWM signal, after a feedback control is implemented, see below, is the input to the delta sigma quantizer 50. Generating a PWM signal with a full 24-bit resolution would require impossible-to-reach clock frequencies of the order of 1 e+012 Hz. This is why delta sigma quantizer block 50 is necessary; this block has a role to improve the resolution of the output PWM pulse achievable with a finite digital clock. The output of the delta sigma quantizer 50 is a 10-bit word representing the pulse width of the output PWM signal. This 10-bit word is fed to the PWM generation block 50 that generates a PWM signal with a high resolution of 196.608 MHz/180.6336 MHz.

The dead time control block 70 accepts an externally specified dead-time (dead-time is set in discrete steps) and outputs a 10 bit word to the PWM generation block 60. This 10-bit word is the length of the dead-time (blanking pulse) between the PWM pulse for the upper switch and the PWM pulse for the lower switch in one leg of the power converter.

Feedback control block 80 performs control of the output of the power converter based on the feedback from the power stage and the required dead time.

The sample rate converter 10 converts a stream of input data to a stream of data at 192 kHz (for input sampling frequencies of 48 kHz, 96 kHz, 192 kHz) or 176.4 kHz (for input sampling frequencies of 44.1 kHz, 88.2 kHz and 176.4 kHz). The input data can be 16-bit, 20-bit or 24-bit input data.

Figure 2:
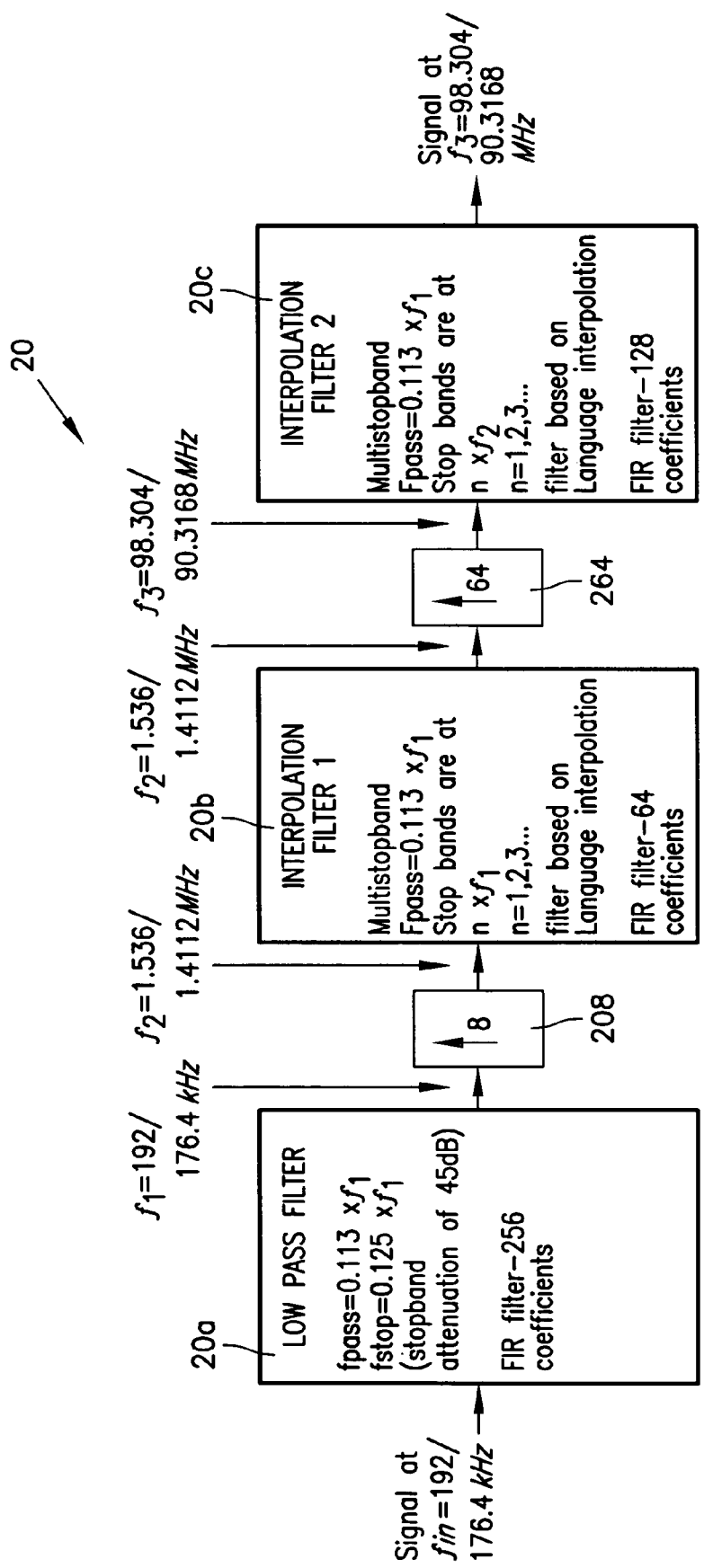
FIG. 2 is a block diagram of the filter block of FIG. 1.

An example of the filter block 20 is shown in detail in FIG. 2. The overall filter block 20 includes a low pass filter 20A, interpolation filter 1 (20B), and interpolation filter 2 (20C). The overall filter 20 upsamples its input data from the frequency of 192/176.4 kHz to the frequency of 98.304 MHz/90.3168 MHz. The filters are designed in such a way as to support all of the input sampling frequencies with a single set of coefficients. All of the filters are chosen to be Finite Impulse Response (FIR) filters because FIR filter structures are not prone to limit cycle oscillations as opposed to IIR filter structures. INTERPOLATION FILTER 1 and INTERPOLATION FILTER 2 are both designed as multi stop-band filters rather than low pass filters to allow for maximum attenuation with a minimum number of coefficients.

The filter is implemented in three stages because this reduces the number of computations required for the overall filter up-sampling operation. The first one is a low pass filter 20A that accepts a stream of data at 176.4/192 kHz. It is designed to sufficiently attenuate the lowest expected aliased frequency in the input, which is 22.05 kHz. The second filter 20B (INTERPOLATION FILTER 1) implements the interpolation of the intermediate signal. The third filter 20C (INTERPOLATION FILTER 2) implements the final interpolation of the signal and produces a signal at the frequency of 98.304 MHz /90.3168 MHz.

The volume control 30 is implemented as a "gradual" control, in that the actual volume approaches the desired volume at a rate of change that is limited (in absolute value). The desired volume value is set externally.

The cross-point estimator 40 calculates the cross-point between the input signal and the virtual "ramp" at the switching frequency of the power stage. The calculation is performed based on the linear interpolation of the input signal between the samples. The block basically solves for the cross point between two lines with a 24 bit precision.

Figure 3:
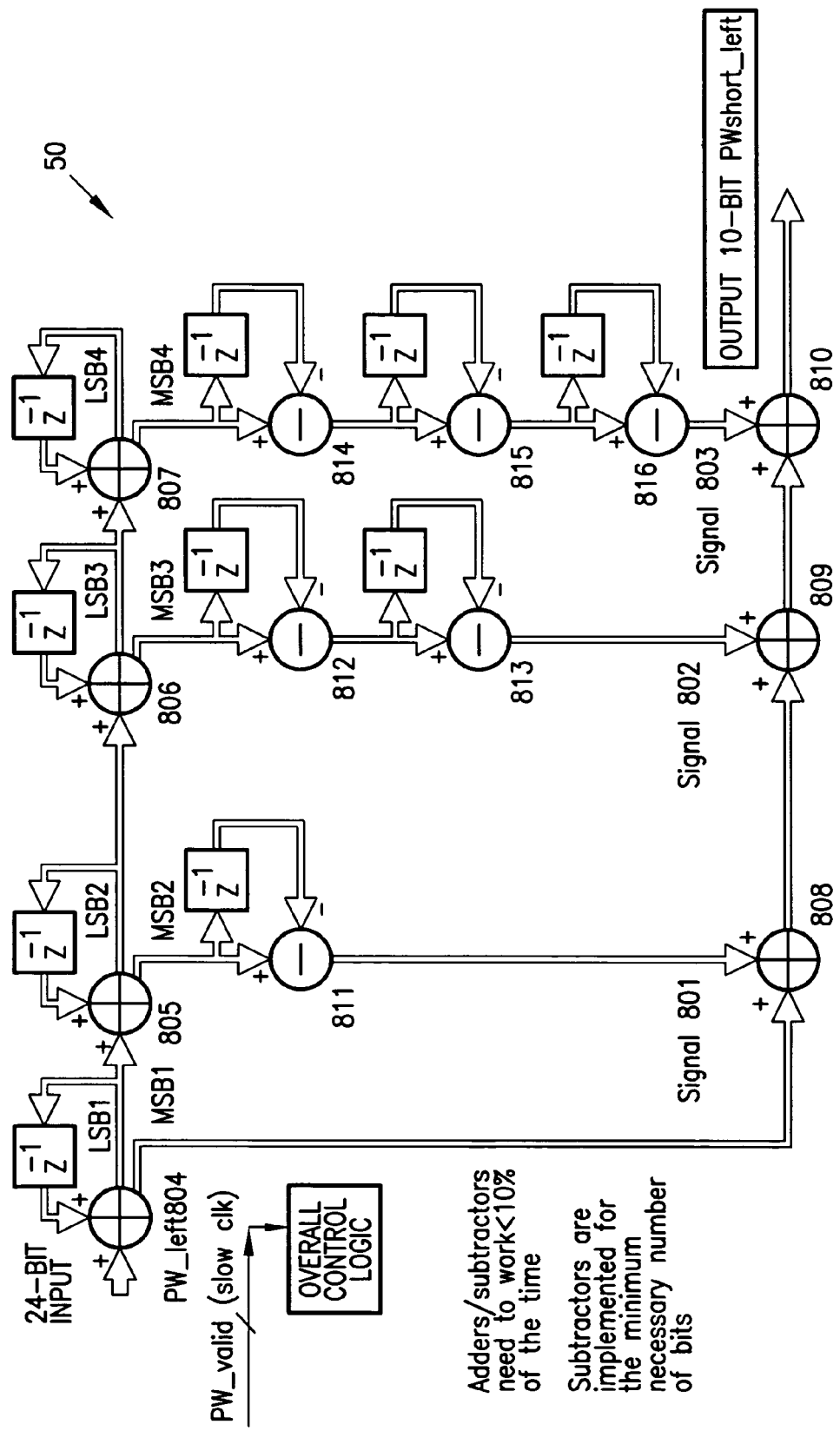
FIG. 3 is a block diagram of the delta sigma quantizer of FIG. 1 for one channel.
Figure 4A:
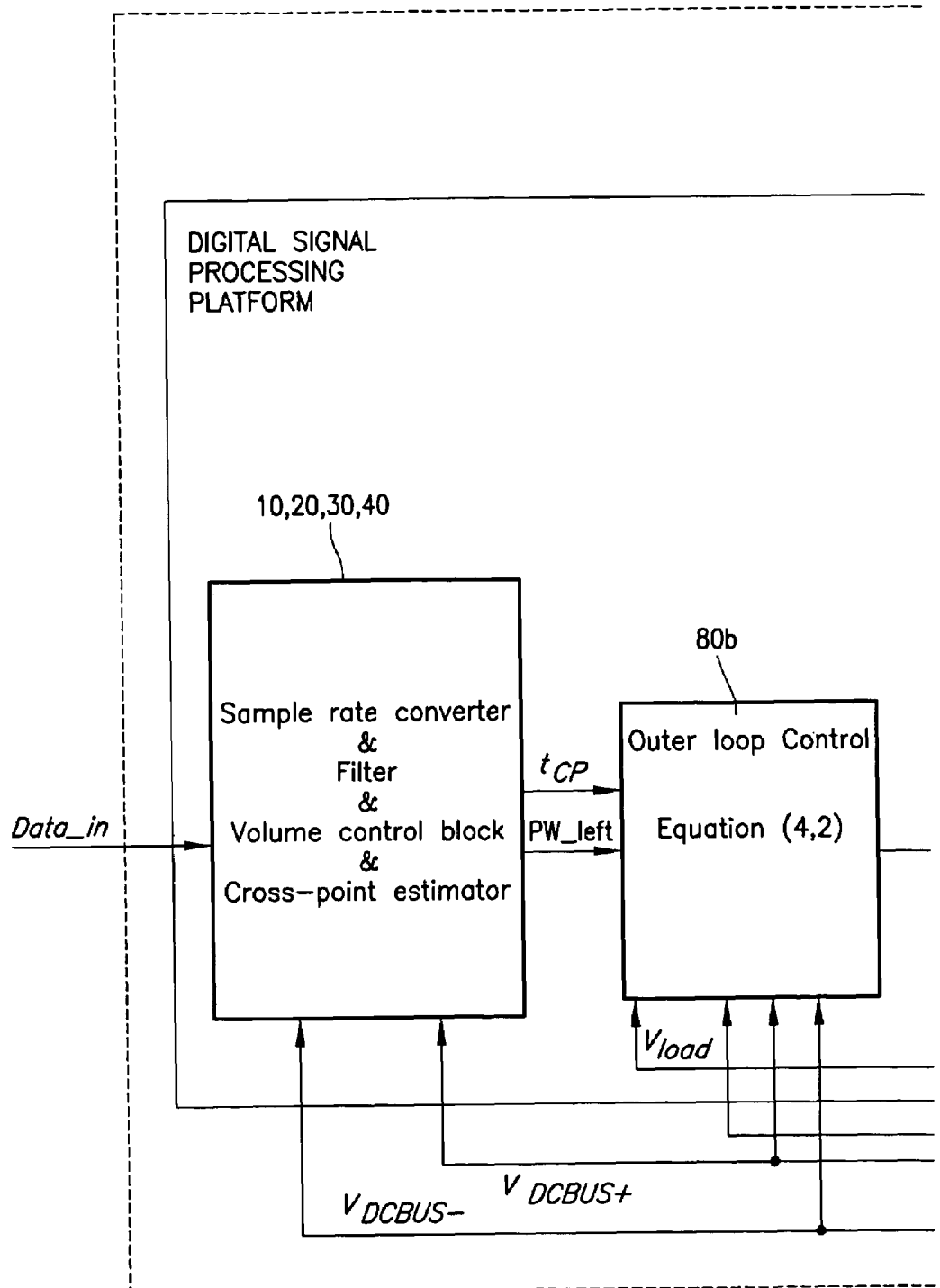
FIG. 4 is a block diagram of the control flow of the circuit of FIG. 1 showing the feedback control.
Figure 4B:
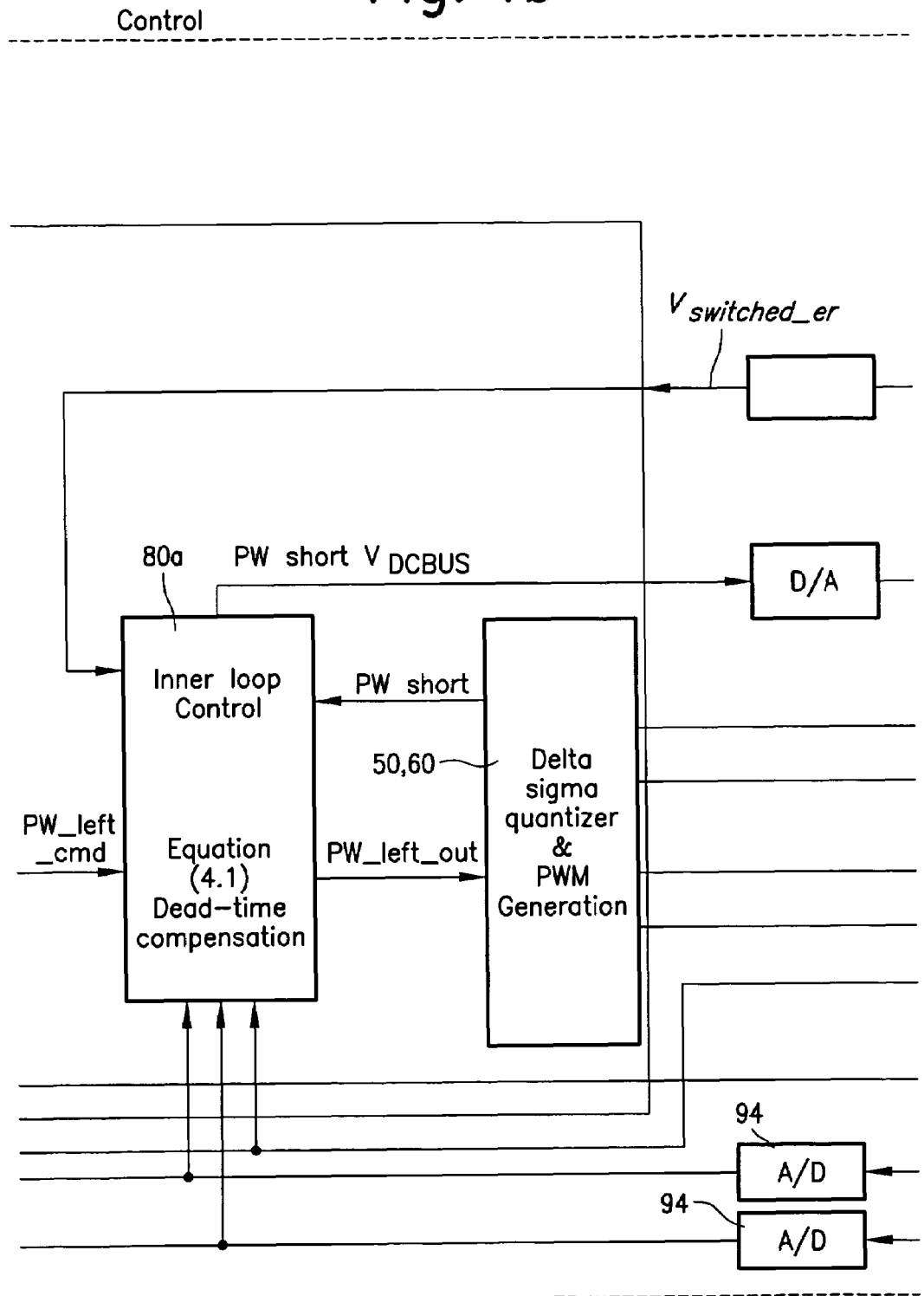
Figure 4C:
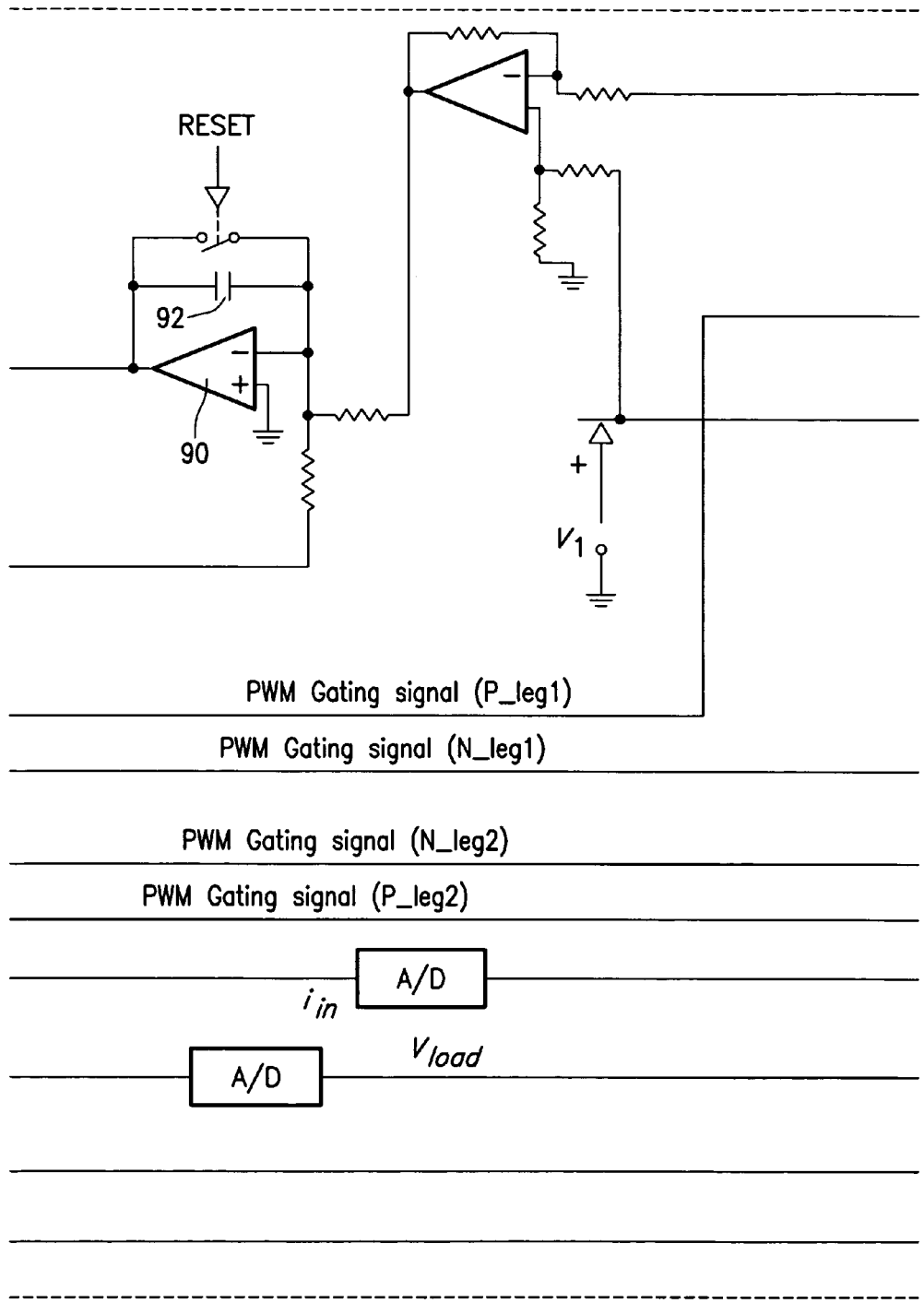
Figure 4D:
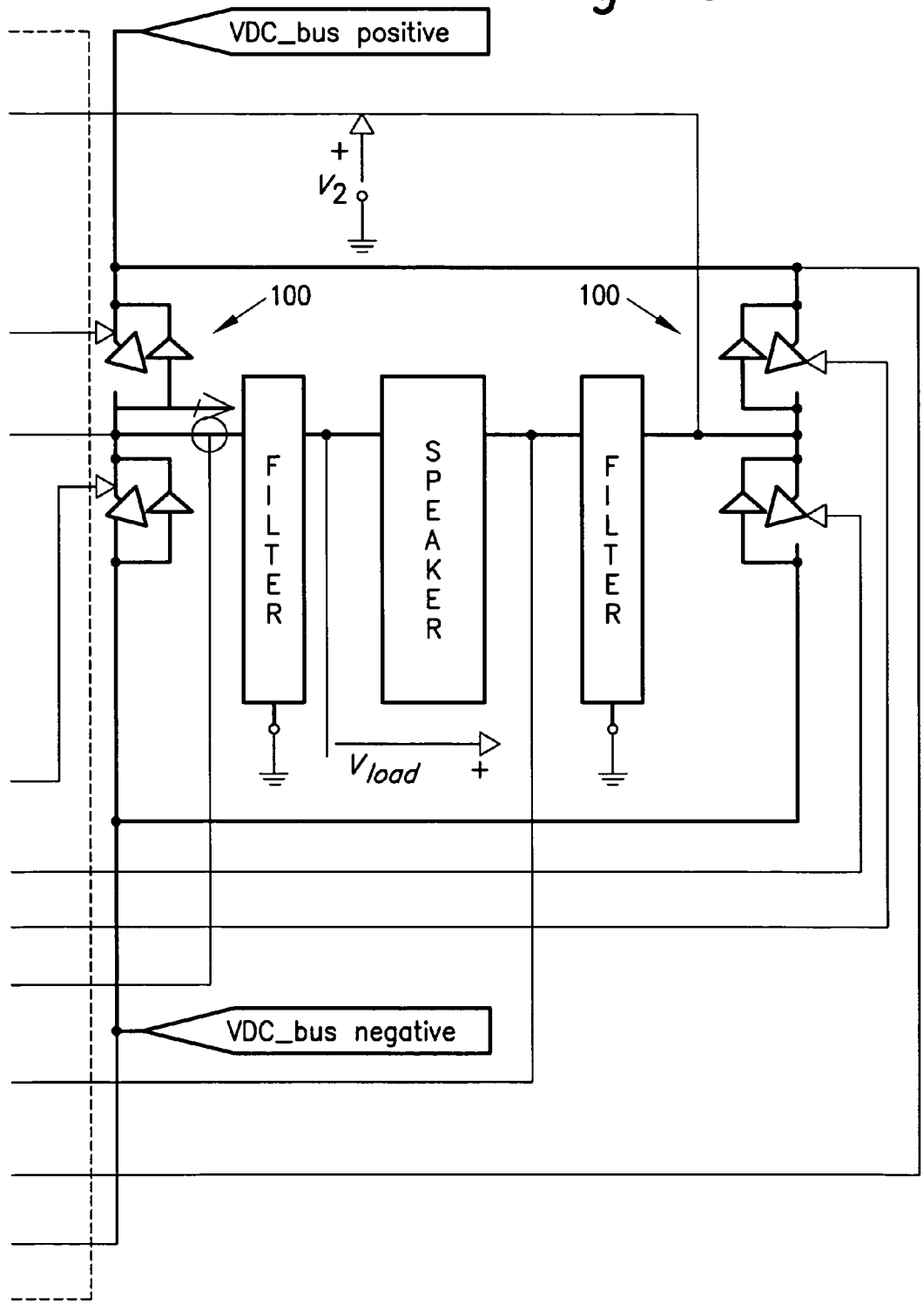

The delta sigma quantizer 50 is shown in detail in FIG. 3. It is a fourth order quantizer, based on a second-order interpolating D/A converter structure. The input to the quantizer are 24-bit words. The output of the quantizer are 10-bit words.

The delta sigma quantizer 50 has a role to improve the resolution of the output PWM pulse achievable with a finite digital clock. The improvement is achieved by introducing additional switching events between the adjacent output signal levels so that the averaged output signal level follows the input more closely.

The PWM generation block 60 generates the PWM pulses by constantly comparing the 10-bit output of the delta sigma quantizer to the value of an up-counting counter. The counter is reset at the beginning of each PWM period. The PWM pulse is set at the beginning of each PWM period and reset when the counter value exceeds the 10-bit output of the delta sigma quantizer.

Dead time is set externally and the PWM pulse is adjusted by the PWM generation block 60 to reflect the desired dead time set by the dead time control block 70.

The feedback control 80 consists of an inner control loop 80A and an outer control loop 80B. See FIG. 4.

The inner control loop 80A performs a control of the average value of the unfiltered (switched) voltage across the load (loudspeaker). The inner loop 80A compensates for the dead-time and the finite turn-on/turn-off time of the transistors in the power stage.

The outer loop 80B performs a control of the loudspeaker voltage. The outer loop 80B compensates for the losses in the filter and losses in the output circuit.

Figure 5:
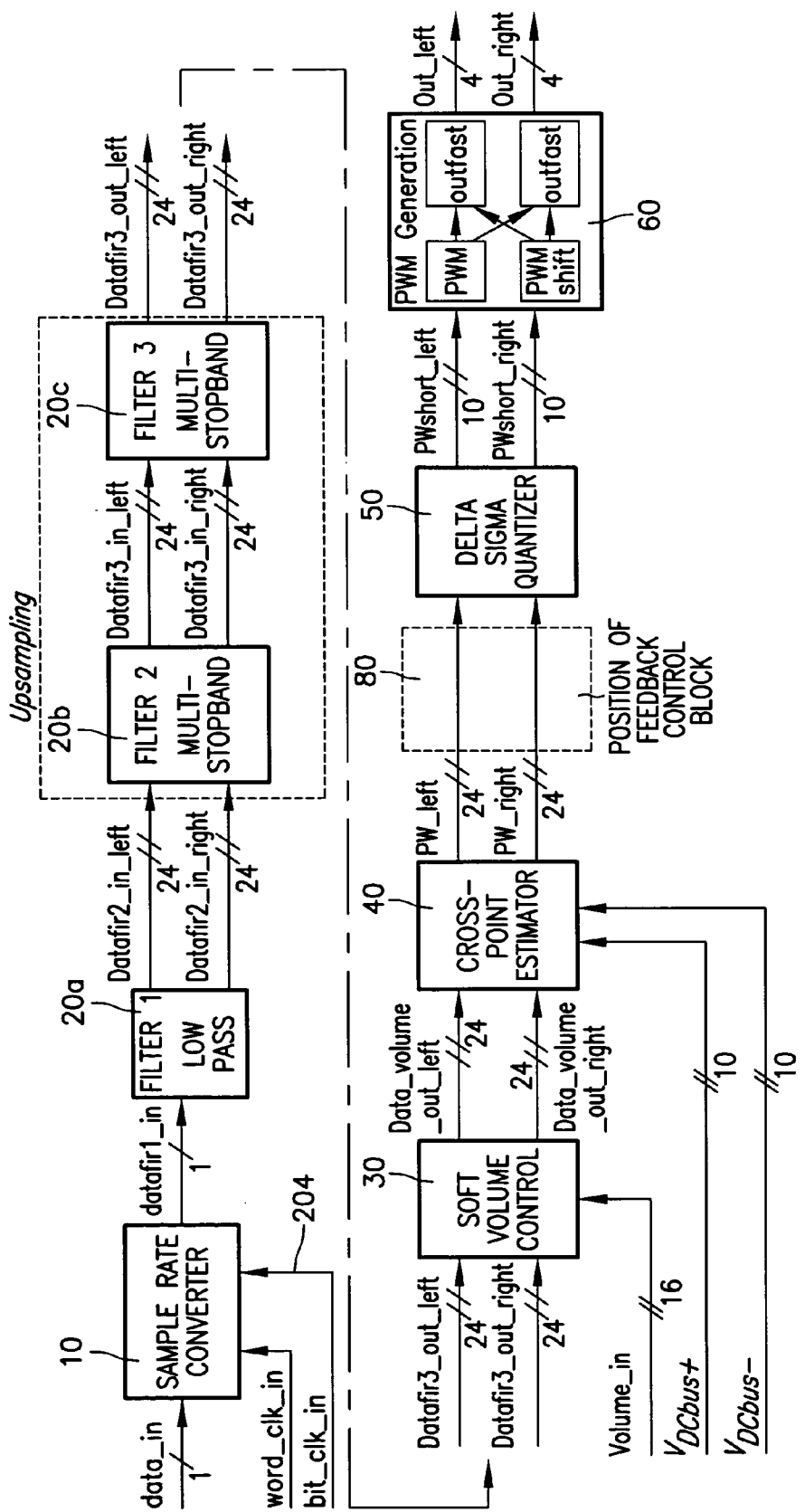
FIG. 5 is a block diagram of the PCM to PWM conversion in greater detail with feedback control omitted.

A more detailed block diagram of the implementation of the invention is given in FIG. 5. The chip architecture, as it is described in this section, is suitable for FPGA implementation. However, it should be understood that this architecture is given only as an example and that modified architectures, achieving the same functionality, may be favorable for ASIC implementation. For example, in ASIC implementation of this design, higher clock frequencies may be attainable, allowing the same number of multiplications and additions to be performed by fewer arithmetic circuits, in order to save silicon area. Implementation-related remarks are added to the description of the building blocks, where applicable.

Figure 6:
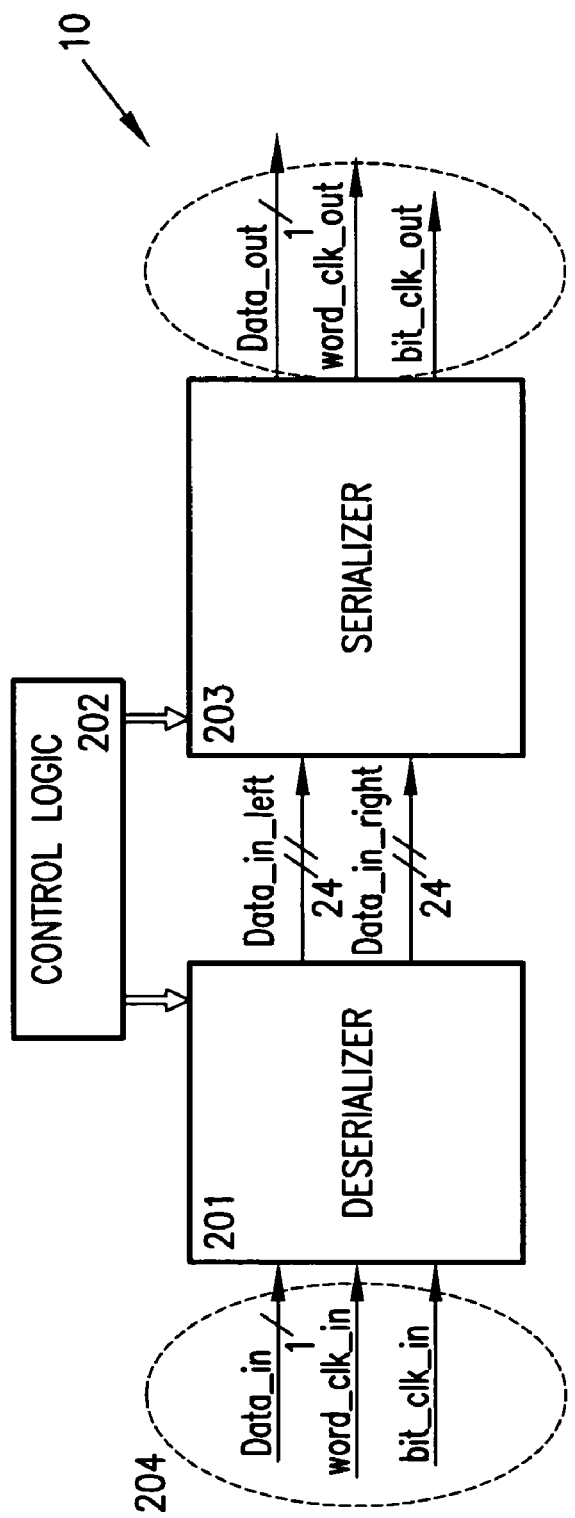
FIG. 6 is a block diagram of the sample rate converter of FIG. 1.

The sample rate converter 10 is shown in FIG. 6 in more detail. It accepts a stream of data that represents the PCM coded audio input for two audio channels, here called left and right. The actual number of implemented channels is arbitrary.

The sample rate converter consists of the deserializer 201 and serializer 203, shown in FIG. 6. The deserializer is a shift register that continually accepts the serial input and converts it into two sets of 24-bit outputs, one for each channel. When values of the left and right channel data are valid at the deserializer outputs, the deserializer output is sampled by control logic 202 and written to two rotating registers (RR) of the serializer 203 using the input clock bit_clk_in 204. The frequency of bit_clk_in may be 48(44.1), 96(88.2) or 192 (176.4)kHz, depending on the equipment driving this chip. The RR content is being rotated through each of the registers using a local, 192(176.4)kHz clock. The most significant bit of each RR is designated as the output. The control logic 202 multiplexes these two outputs into one output bit stream of the sample rate converter. The frequency of the output is 192 kHz/176.4 kHz. This way the input data is up-sampled to the n-times higher output frequency by simply repeating an input datum n times. No input pins for the specification of the sampling frequency of the input are necessary, which reduces the overall number of input pins.

Low pass filter 20A, Interpolation filter 1 20B and Interpolation filter 2 20C, shown in FIG. 5, are preferably implemented as direct form structures (also referred to as tapped delay line structures or transversal filter structures).

As shown in FIG. 2 at 208, the data stream is upsampled 8 times before being filtered by the Interpolation filter 1 and then is upsampled 64 times at 264 before being filtered by the Interpolation filter 2. In both of these cases, the upsampling by the factor of n is done by simply inserting (n-1) zeros between the existing samples. In order to significantly minimize the number of computations involved in implementation of Interpolation filters 1 and 2, only the non-zero samples are actually multiplied by the coefficients of the filters and summed up to produce the output.

Figure 7:
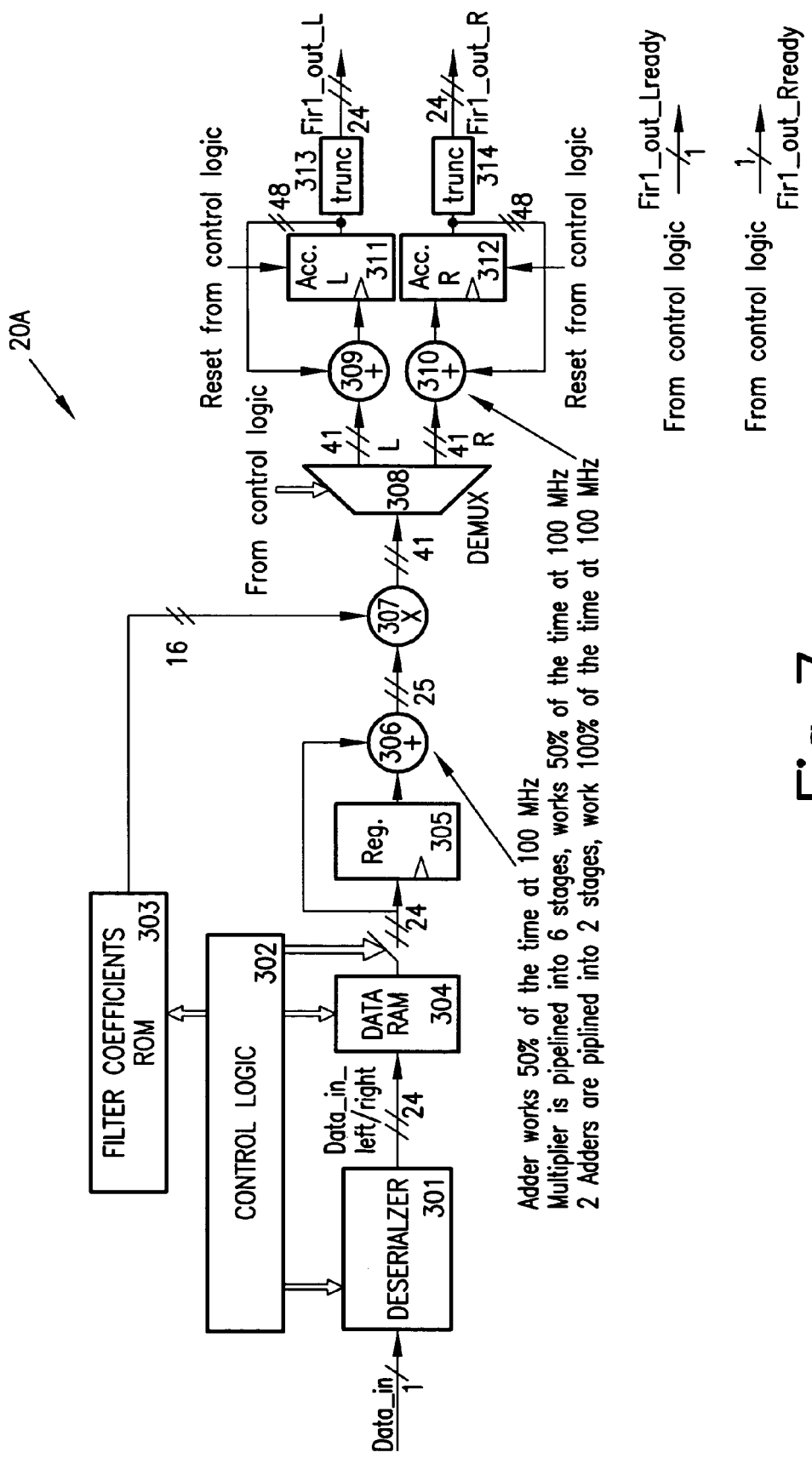
FIG. 7 is a block diagram of the low pass filter of FIG. 5.

The block diagram of the low-pass filter 20A is shown in FIG. 7. The input block is deserializer 301, equivalent to 201 described above. The deserializer 301 separates the left and right channel data received from the sample rate converter 10 and outputs them in parallel, 24-bit representation. When the deserializer output is valid, it is written to the data RAM 304. Exploiting the symmetry of the filter 20A, the pairs of data samples to be multiplied by the same coefficient are added first, thus reducing the number of multiplications by one half. This is achieved by reading data samples making up a pair one after another and delivering them to the input of adder 306 which adds the RAM output with the RAM output of the previous clock cycle, stored in register 305. The obtained sum is multiplied with the corresponding filter coefficient, read from the filter coefficient ROM 303, by multiplier 307. Multiplications for both channels are performed by multiplier 307, capable of processing one multiplication per clock cycle at a clock frequency of 98.304 MHz. The results of multiplication associated with different channels are separated by demultiplexer 308 and processed separately by two adder-accumulators (left: 309, 311; right: 310, 312). The accumulator outputs are presented to the filter output truncated by truncators 313 and 314 to 24-bit resolution. The accumulators 311, 312 are reset at the beginning of each filter period. Signals controlling memory 303, 304 access, the demultiplexer 308. and accumulator reset are driven by control block 302.

Operation at the clock frequency of 98.304 MHz requires the use of 3 adders (306, 309, 310) one of which (306) is operating only 50% of the time whereas the two others are operating 100% of the time. For an implementation technology in which adders 306, 309 and 310 can operate at the frequency of 150 MHz it would be possible to replace adder 306 and one of the other two with one operating at 150 MHz. Further, if the implementation technology were to allow adder operation at 250 MHz, all three adders could be replaced with one operating at this frequency. However, it should be noted that sharing of adders would create a non-negligible overhead in multiplexers and control logic.

Figure 8:
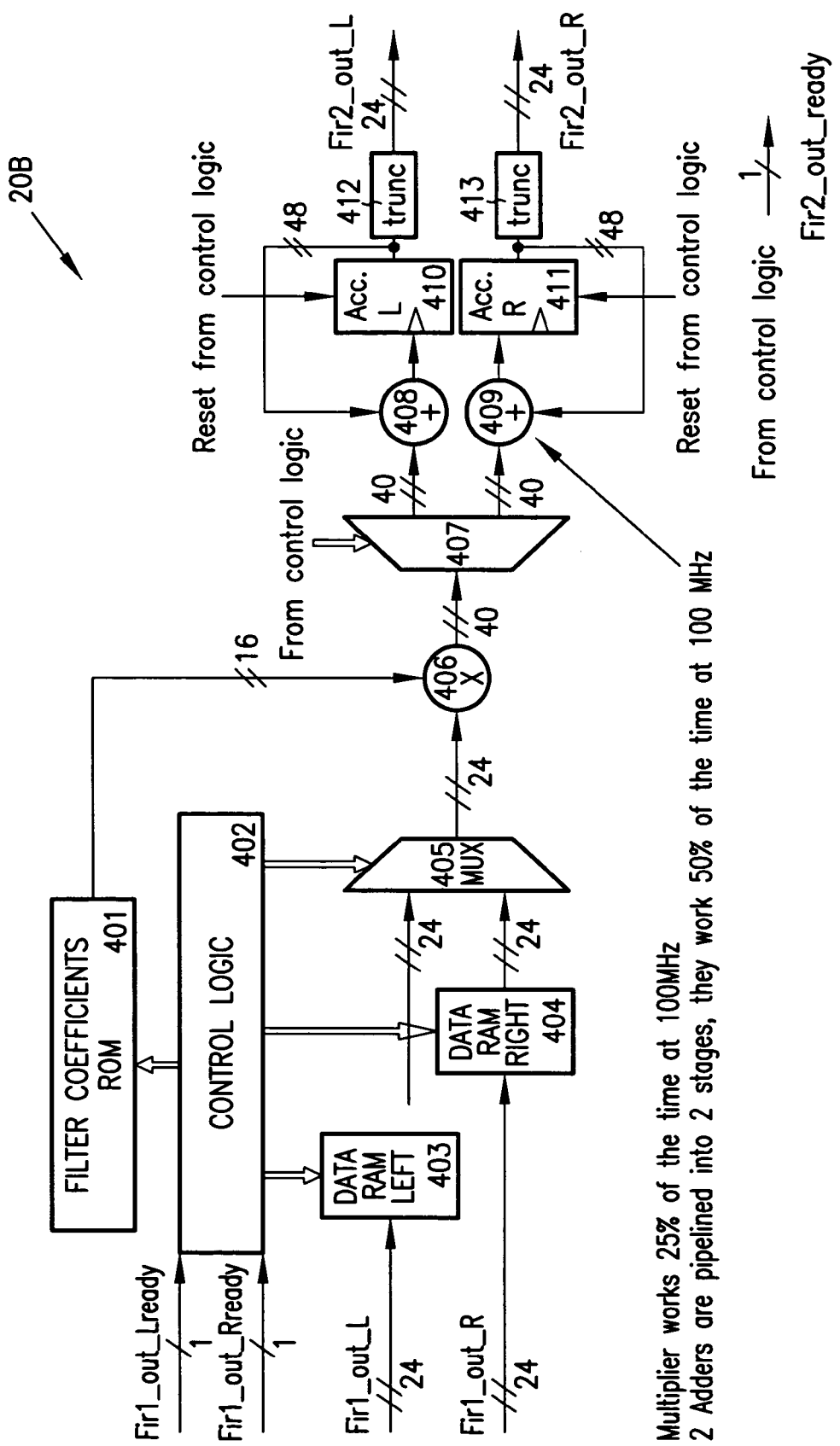
FIG. 8 is a block diagram of the interpolation filter 1 of FIG. 5.

The block diagram of interpolation filter 1 (20B) is shown in FIG. 8.

Data inputs for each channel, driven by low pass filter 20A, are written to two separate data RAM blocks 403 and 404. Filter coefficients are stored in the look-up table 401, which can be implemented as ROM or RAM. Data-coefficient multiplications for both channels are performed by multiplier 406. Control logic 402 initiates all accesses to memory blocks 401, 403, 404 and control of data multiplexer 405. The multiplier output is demultiplexed into two separate datapaths for the left and right channel. These paths, comprising adder-accumulators, are architecturally equivalent to those in the low pass filter 20A and require no further description. It should be noted that due to interpolation, the data rate at the output of interpolation filter 1 (20B) is higher than the data rate at its input.

Multiplier 406 operates only 25% of the time, when driven by a 98.304 MHz clock. Therefore, multipliers 307 and 406 could be replaced by only one such multiplier, which would be active 75% of the time when driven by a 98.304 MHz clock. Adders 408 and 409 are active only 50% time each for the clock frequency of 98.304 MHz and could be replaced by one such adder, operating at the same frequency.

Figure 9:
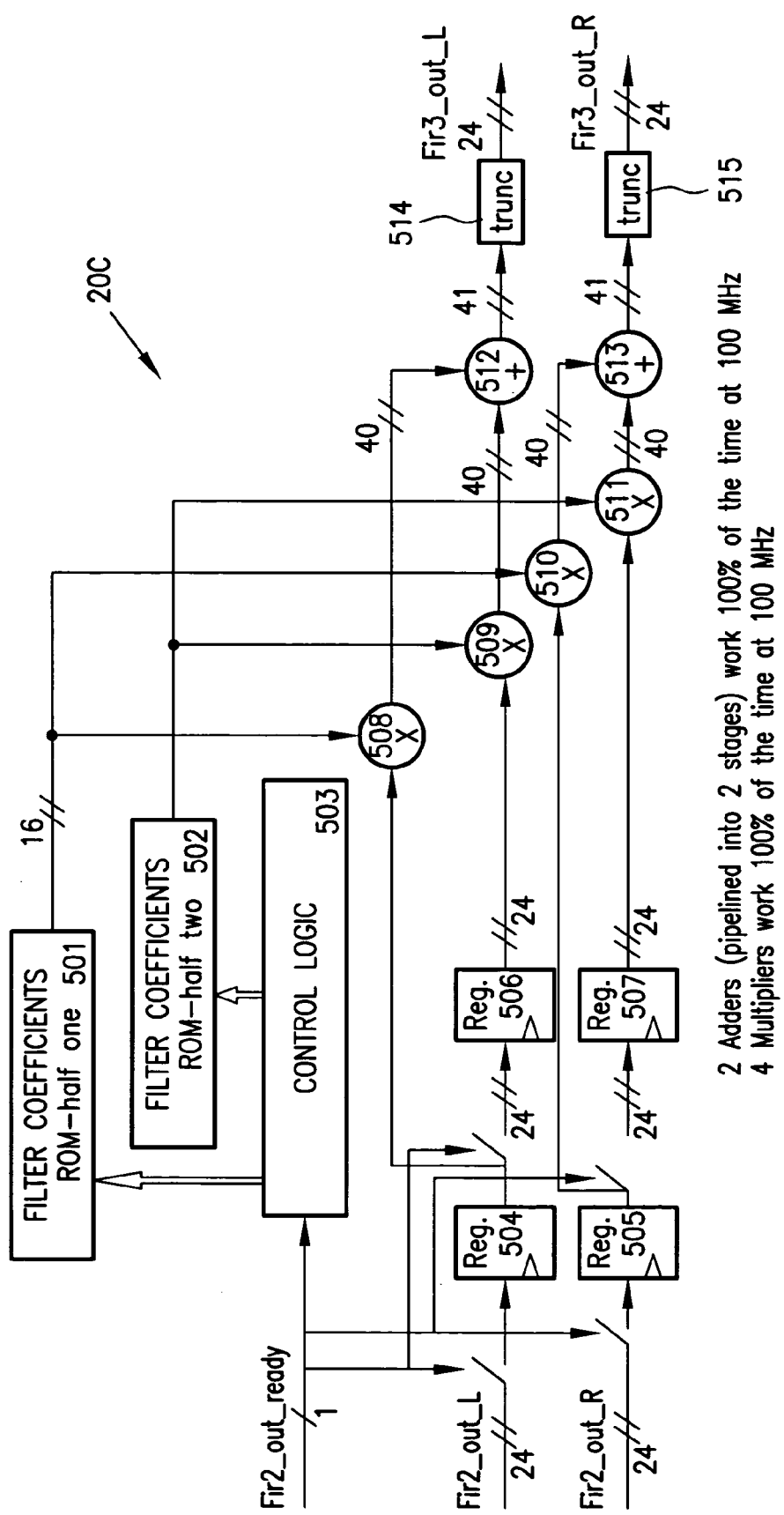
FIG. 9 is a block diagram of interpolation filter 2 of FIG. 5.

The block diagram of interpolation filter 2 (20C) is shown in FIG. 9.

Due to the specific architecture of this filter, which involves a sum of only two data-coefficient products, RAM for storage of data inputs is not necessary. Since only two data inputs per channel are stored at any given time, four registers 504, 505, 506 and 507 are used for this purpose. However, despite the simplicity of the filter, the computation rate of interpolation filter 2 is very high, since the up-sampling factor of this filter is 64, producing a pair of data outputs (left and right) in each 98.304 MHz clock cycle. This implies that 4 multiplications need to be performed in every clock cycle, requiring the implementation of 4 separate parallel multipliers 508, 509, 510 and 511. Control block 503 is responsible for reading of filter coefficients from look-up tables 501 and 502. These two look-up tables store the same coefficients only in a different order. The use of two tables is needed in order to ensure the required throughput. The two products for each data path are summed by adders 512 and 513. The filter outputs are the adder outputs, truncated to 24 bits each by truncators 514 and 515.

Implementation in a technology that allows the clock frequency of this filter to be increased to 200 MHz would be beneficial because it would allow reduction of the number of multipliers, adders and look-up tables by a factor of 2.

Figure 10:
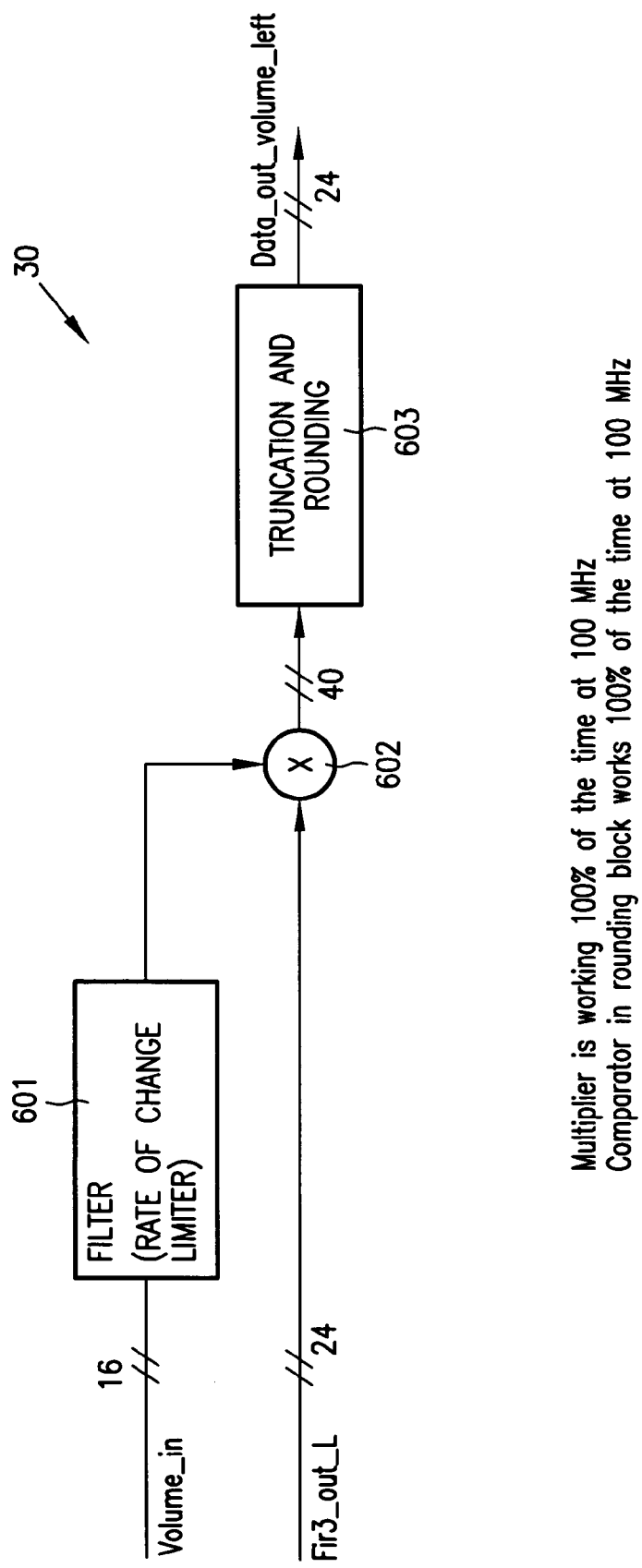
FIG. 10 is a block diagram of the volume control for one channel of FIG. 5.

The architecture of the soft volume control block is shown in FIG. 10. There are two identical soft volume control blocks, one for each channel.

The signal volume_in, representing the user-specified desired volume level, is fed through a rate change limiter filter 601. Filter 601 is implemented as a simple counter which increments or decrements (at the limited pace of once every m clock cycles) the volume control value stored in a register, towards the value of volume_in. The volume control register value is the output of filter 601. This value is multiplied in Multiplier 602 by the input data driven by interpolation filter 2 (20C). The multiplier output is truncated at 603 to 24 bits and represents the output of the volume control block.

Figure 11:
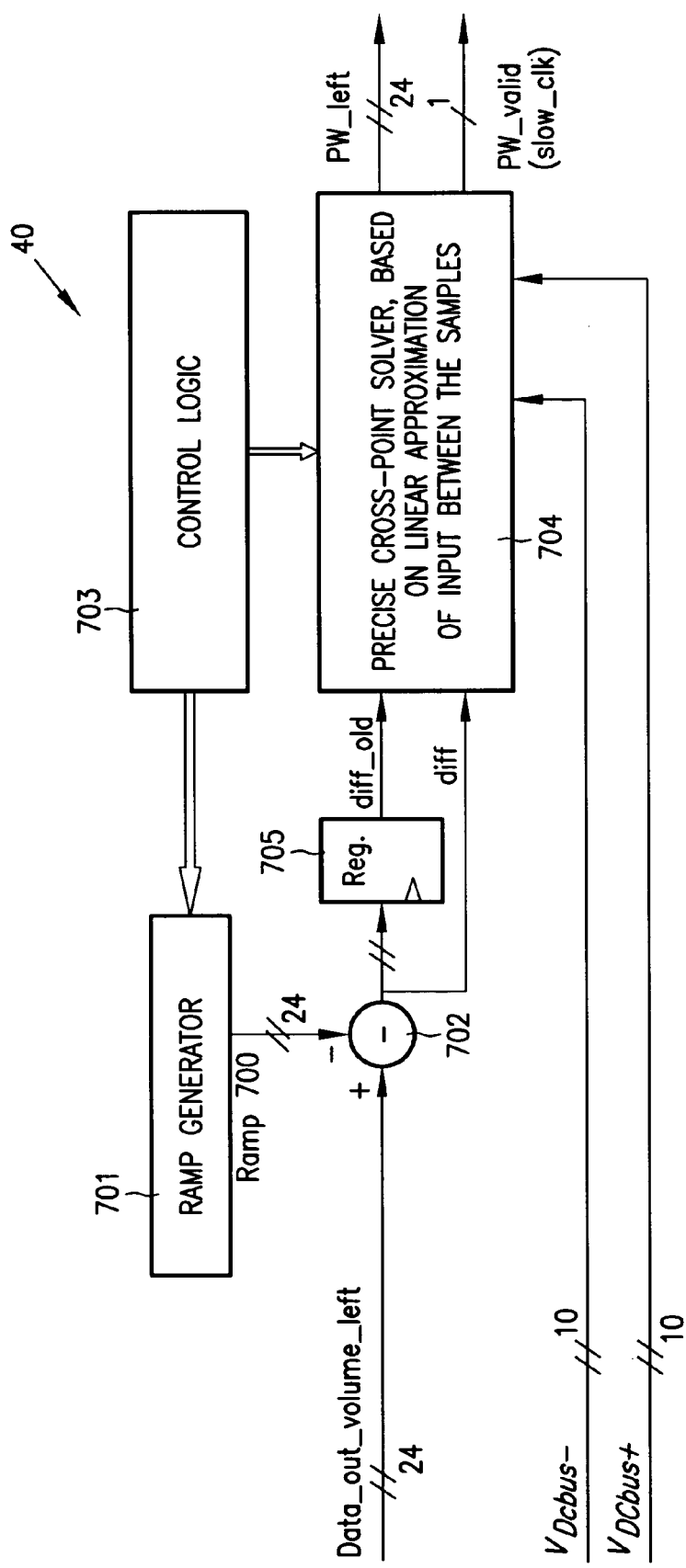
FIG. 11 is a block diagram of the cross-point estimator for one channel of FIG. 5.

The architecture of the cross-point estimator is shown in FIG. 11. Each of the two channels (left and right) contains one cross-point estimator block. The operation is described only for the left channel.

The operation described in this paragraph assumes a positive input data signal that crosses a positive ramp. The operation for the negative input data occurs in an analogous fashion. Ramp generator 701, which is shown in FIG. 11, generates ramp700 as a 24 bit digital ramp signal. The absolute value of ramp generator701 is actually an up counter that is reset at the beginning of each switching period (of the power stage) and is incremented by $2^{14}$ each clock cycle. Ramp700 is subtracted from the input data signal by subtractor 702. The output of the subtractor 702 is denoted as diff. The subtraction result from the previous cycle is stored in register 705. The output of register 705 is denoted as diff_old. The first time the subtraction result diff is negative, the precise cross-point solver 704 is activated. This block uses the current (negative) and the previous (positive) subtractor output values to solve, for the precise cross-point between the 24-bit input data and 24-bit ramp700. The solution is based on the linear approximation of the input signal between the existing input data. 24-bit cross-point $t_{CP}$ is calculated as:

$$t_{CP} = ramp700_{diff<0} - 2^{14} + \frac{\text{diff\_old}}{\text{diff} + \text{diff\_old}}$$

where ramp700$_{diff<0}$ denotes the value of ramp700 in the very clock cycle in which diff becomes negative. To solve for the cross point $t_{CP}$, an algorithmic divider is implemented. Cross-point $t_{CP}$ actually represents the desired pulse width of the output PWM signal, given in increments $1/(2^{23-1})$ of of the switching period.

For the nominal input DC_bus voltage (for the prototype it is equal to +/−50 V), the block output PW_left is equal to $t_{CP}$; otherwise PW_left is for positive data input calculated in the following way:

$$\text{PW\_left} = t_{CP} \cdot \frac{731}{V_{DCBUS+}} \qquad \text{Equation (3D.1)}$$

In (3D.1), $V_{DCBUS+}$ is a 10-bit word which corresponds to the latest sample of positive DC_bus voltage where all zeros correspond to 0 volts and 731 correspond to 50 V. In case of the negative data input, PW_left is calculated in the analogous way by replacing $V_{DCBUS+}$ by absolute value of negative DC_bus voltage in (3D.1). An algorithmic divider is used to implement (3D.1) and is used for this purpose only once in the switching period of the power stage. The cross-point estimator block also outputs a 1-bit signal named slow_clk, which is periodical with 15 a frequency equal to the switching frequency of the power stage. The rising edge of slow_clk signals that PW_left is valid. In the case when there is no feedback control block (open-loop control) the outputs of this block go to the input of the delta sigma quantizer 50; when there is a feedback control employed in the system, the outputs of this block go to the feedback control block 80.

In order to optimize for area, the value of ramp700 is stored in hardware as an unsigned 8-bit number; this is possible because out of 24 bits, the sign of ramp700 is handled separately and the lower 15 bits are always 0.

Signal diff (and therefore diff_old) has the maximum value of less than $2^{\wedge}16$ and is therefore stored in hardware as a 15 bit number.

The architecture of the delta sigma quantizer 50 is shown in FIG. 3. Each of the channels (left and right) has one of the delta sigma quantizer blocks. The implementation of this block is described only for the left channel.

The input to this block is a 24-bit word PW_left, which represents the desired pulse width of the output PWM signal. In the case when there is a feedback control block 80, 24-bit input to the delta sigma quantizer 50 will not come straight from the cross-point estimator block 40 but from the feedback control block 80. This input is quantized by the quantizer 50 to produce a 10-bit output PWshort_left, which will be the actually implemented pulse width of the output PWM signal. A fourth order noise shaping of the quantization noise is performed by this quantizer to significantly reduce THD of the final PWM signal in the band of interest as compared to the case of direct truncation of the input 24-bit signal to 10 bits. The noise shaping of the digitally coded signal is in principle done by allowing the least significant bits of the input to accumulate until they overflow into the most significant bits and contribute to the output.

Fourteen least significant bits of the outputs of adders 804, 805, 806 and 807 are denoted as LSB1, LSB2, LSB3 and LSB4 respectively. Ten most significant bits of adders 804, 805, 806 and 807 are denoted as MSB1, MSB2, MSB3 and MSB4 respectively. All of the adders and subtractors can be 24-bit adders and subtractors. The overall architecture can be optimized for the minimum necessary number of bits as explained below.

Adders 805, 806 and 807 actually perform addition of two 14-bit numbers, where MSB1, MSB3 and MSB4 are carry bits of adders 805, 806 and 807 respectively. Therefore, if the architecture is to be optimized for the minimum necessary number of bits, the arithmetic units are preferably implemented in the following way: a) adders 805, 806 and 807 are 14-bit adders, b) subtractors 811, 812 and 814 are 1-bit subtractors, c) subtractors 813 and 815 are two bit subtractors, d) subtractor 816 is a 3-bit subtractor and e) adders 808, 809 and 810 are 11-bit adders (the final output PWshort_left is limited to 10 bits).

Block 50 actually works at a pace of the switching frequency of the output power stage (either 384 kHz or 768 kHz); accordingly the delay blocks $z^{-1}$ in FIG. 3 represent delays of either 1/384 kHz or 1/768 kHz. Since the working frequency of the delta sigma quantizer 50 is very slow, all of the additions/subtractions could be implemented with one 24-bit adder operating at a frequency of 98.304 MHz.

Figure 12A:
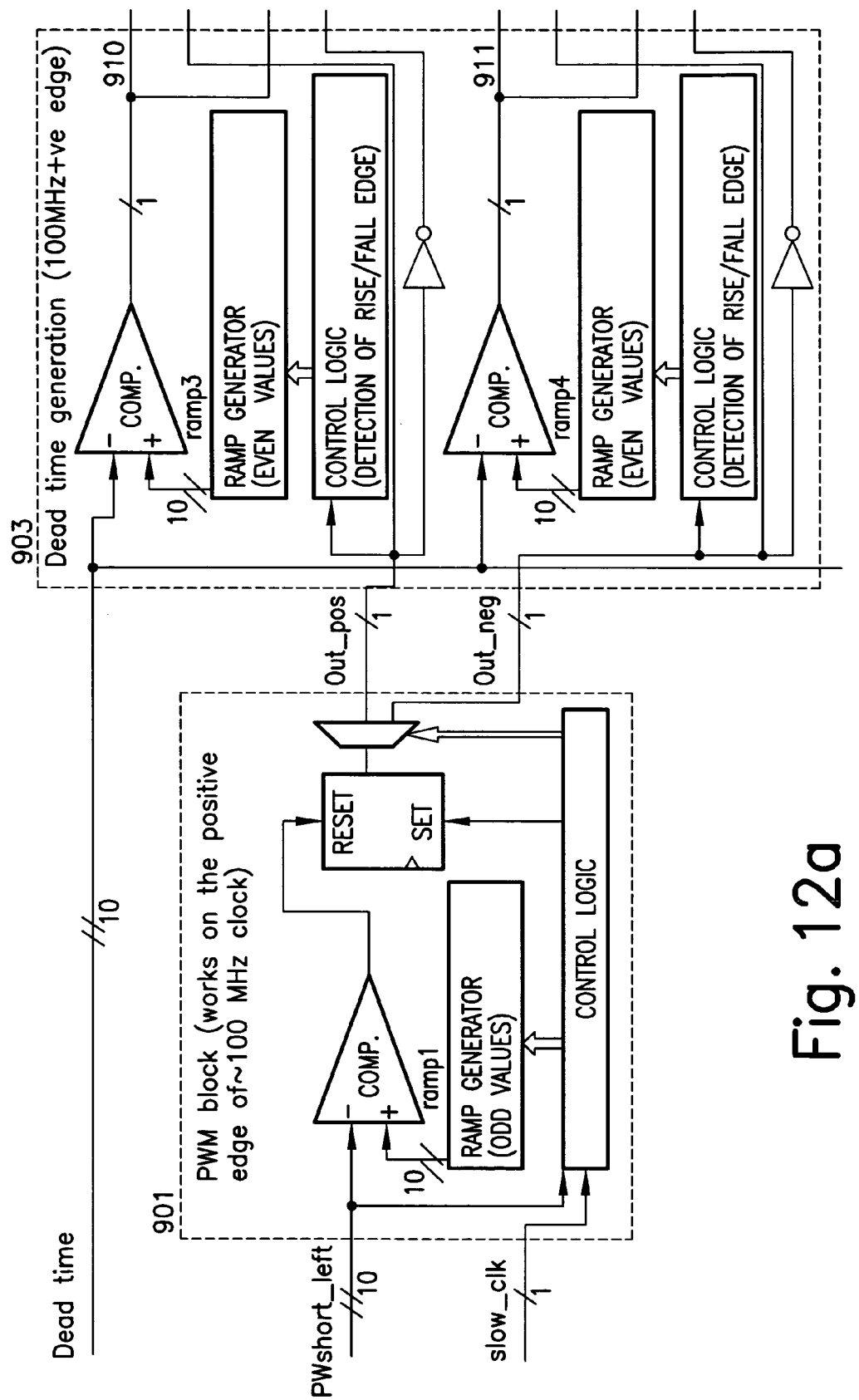
FIG. 12 is a block diagram of the PWM generation block for one channel shown in FIG. 1 and FIG. 5.
Figure 12B:
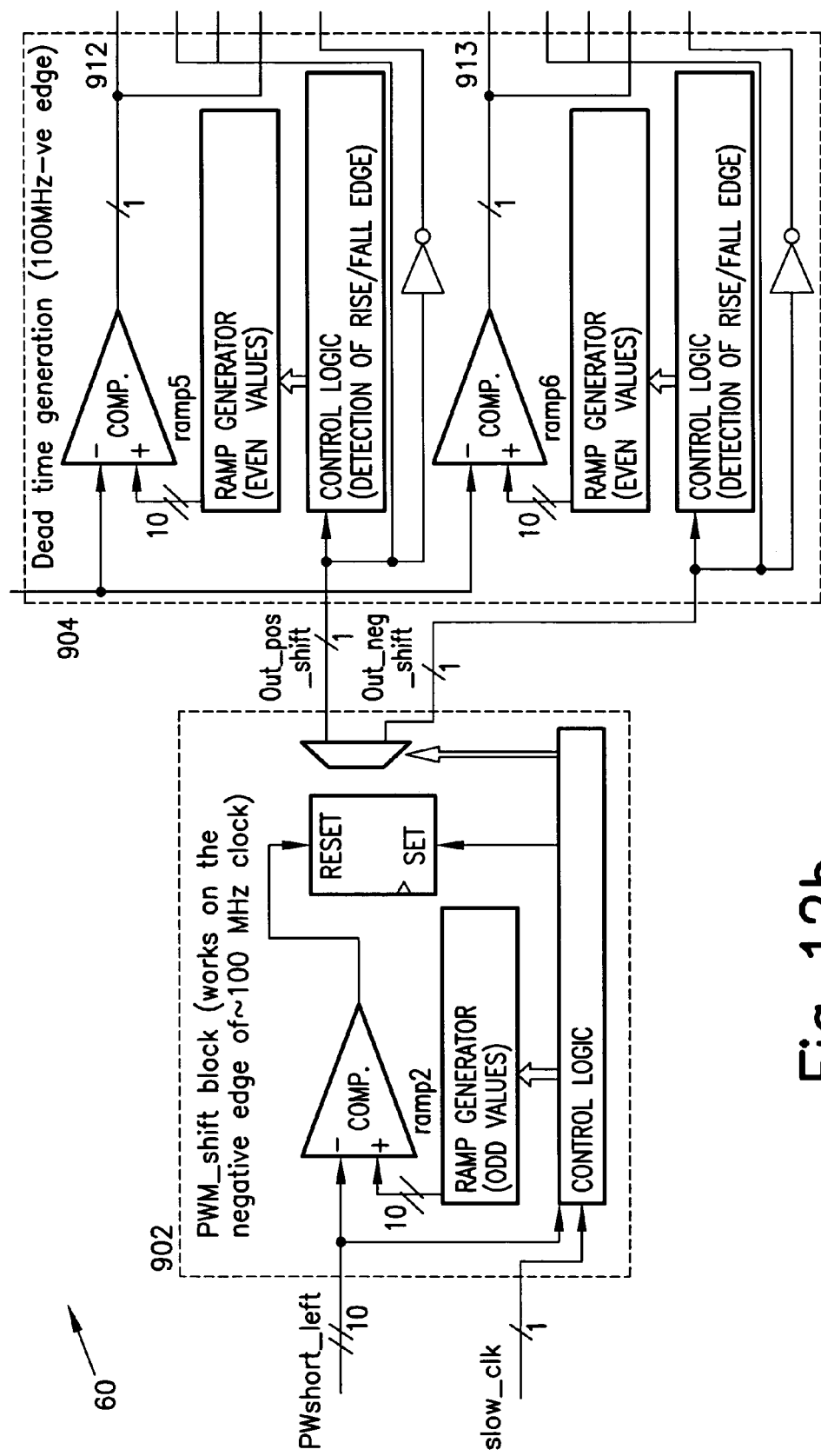
Figure 12C:
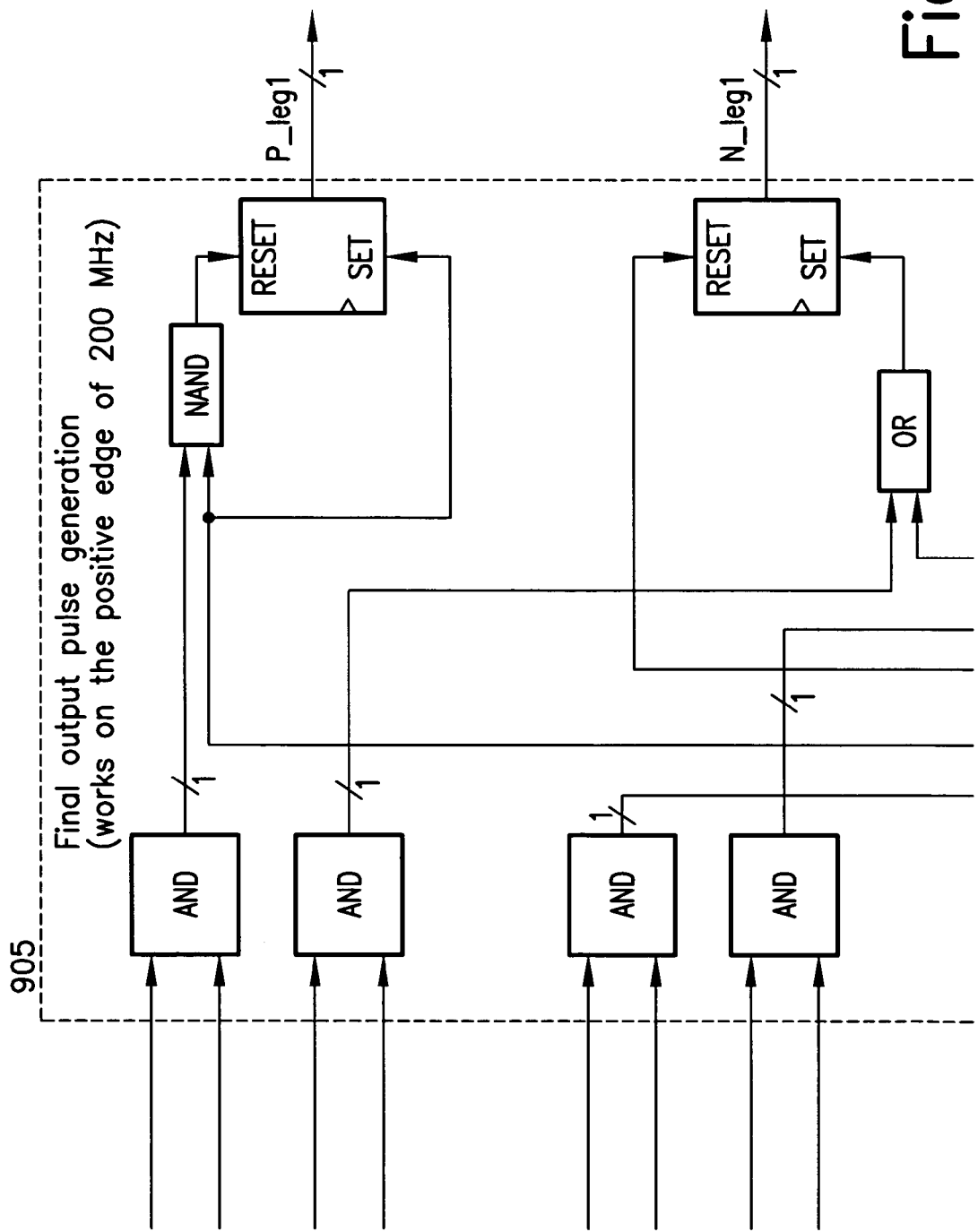

The architecture of the PWM generation block 60 is shown in FIG. 12. Each of the two channels (left and right) has one PWM generation block.

The block architecture, as shown in FIG. 12 assumes a full bridge power stage with four transistors to be gated, but the same approach can be extended to cover a half-bridge power stage if only block 904 is omitted from the architecture. This architecture is put together specifically to achieve the high resolution of the output PWM signal of 196.608 MHz/180. 6336 MHz, while allowing the majority of the logic to work with a lower clock frequency of 90.3168 MHz. This approach effectively extends the upper working frequency limit of the available FPGA technology.

PWM generation is split into two blocks 901 and 902 which both operate at 90.3168 MHz. Each of these blocks compares the 10-bit input PW_short_left to a 10-bit output of a ramp generator. The ramp generators are actually up-counters that are reset at the beginning of each switching period. Block 901 works at the positive edge of the clock and compares PW_short_left to ramp 1 (ramp1 is reset to 1 at the beginning of every switching period and is incremented by 2 each clock cycle). In the same fashion, block 902 works at the negative edge of the clock and compares PW_short_left to ramp2 (ramp2 is reset to 0 at the beginning of every switching period and is incremented by 2 each clock cycle). The output from block 901 named Out_pos is set to 1 when PW_short_left is positive and PW_short_left is greater than ramp1; Out_pos is reset to 0 otherwise. The output from block 901 named Out_neg is set to 1 when PW_short_left is negative and the absolute value of PW_short_left is greater than the ramp1; Out_neg is reset to 0 otherwise. The output from block 902 named Out_pos_shift is set to 1 when PW_short_left is positive and PW_short_left is greater than ramp2; Out_pos_shift is reset to 0 otherwise. The output from block 902 named Out_neg_shift is set to 1 when PW_short_left is negative and the absolute value of PW_short_left is greater than the ramp2; Out_neg_shift is reset to 0 otherwise.

Blocks 903 and 904 implement dead time control by producing signals 910, 911, 912 are 913, which are reset to 0 for the duration of the dead time and are 1 otherwise. Inputs to block 903 are signals Out_pos, Out_neg and the desired dead time (resolution of dead time is 1/90.3168 MHz). The outputs of block 903 are signals 910 and 911, which are reset to 0 immediately after change in Out_pos and Out_neg respectively. Signals 910 and 911 are subsequently kept at 0 for the time equal to the desired dead time and then set to 1. Similarly, inputs to block 904 are signals Out_pos_shift, Out_neg_shift and the desired dead time. The outputs of block 904 are signals 912 and 913, which are reset to 0 immediately after change in Out_pos_shift and Out_neg_shift respectively. Signals 912 and 913 are subsequently kept at 0 for the time equal to the desired dead time and then set to 1. Block 903 operates on the positive edge of 90.3168 MHz clock, while block 904 operates on the negative edge of 90.3168 MHz clock.

The outputs of blocks 903 and 904 are processed together by a block 905 (this block compares 1-bit numbers only) that is able to operate at a high frequency of (90.3618 MHz). Block 905 produces four PWM outputs P_leg1, N_leg1, P_leg2 and N_leg2. These four PWM outputs are used as gating signals for four transistors in a full-bridge power stage of the audio amplifier and are produced with resolution of 1/(90.3618 MHz). The output P_leg1 is set to 1 when signal 912 is 1 and Out_pos shift is 1. The output P_leg1 is reset to 0 when any of the following four conditions happens: a) signal 912 is 0, b) Out_pos_shift is 0, c) signal 910 is 0 or d) Out_pos is 0. The output N_leg1 is set to 1 when either of the two following conditions happens: a)signal 910 is 1 and complement of Out_pos is 1 or b)signal 912 is 1 and complement of Out_pos_shift is 1. The output N_leg1 is reset to 0 when Out_pos_shift becomes 1. The output P_leg2 is set to 1 when signal 913 is 1 and Out_neg_shift is 1. The output P_leg2 is reset to 0 when any of the following four conditions happens a) signal 913 is 0, b) Out_neg_shift is 0, c) signal 911 is 0 or d) Out_neg is 0. The output N_leg2 is set to 1 when either of the two following conditions happens: a) signal 911 is 1 and complement of Out_neg is 1 or b) signal 913 is 1 and complement of Out_neg_shift is 1. The output N_leg2 is reset to 0 when Out_neg_shift is 1.

It is assumed that the dead time input is given in increments of 1/90.3618 MHz.

Figure 13A:
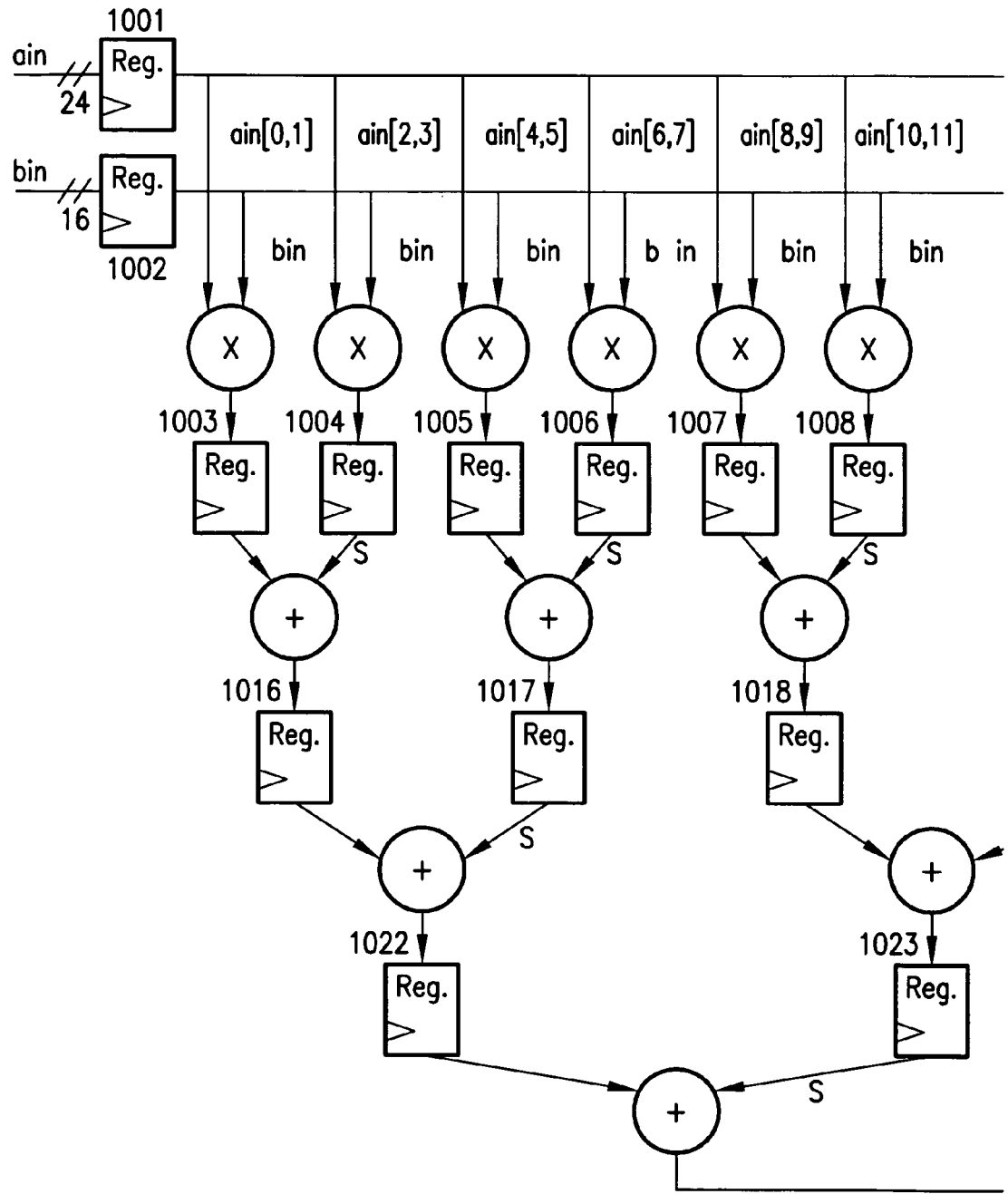
FIG. 13 is a block diagram of the multiplier used in the present invention.
Figure 13B:
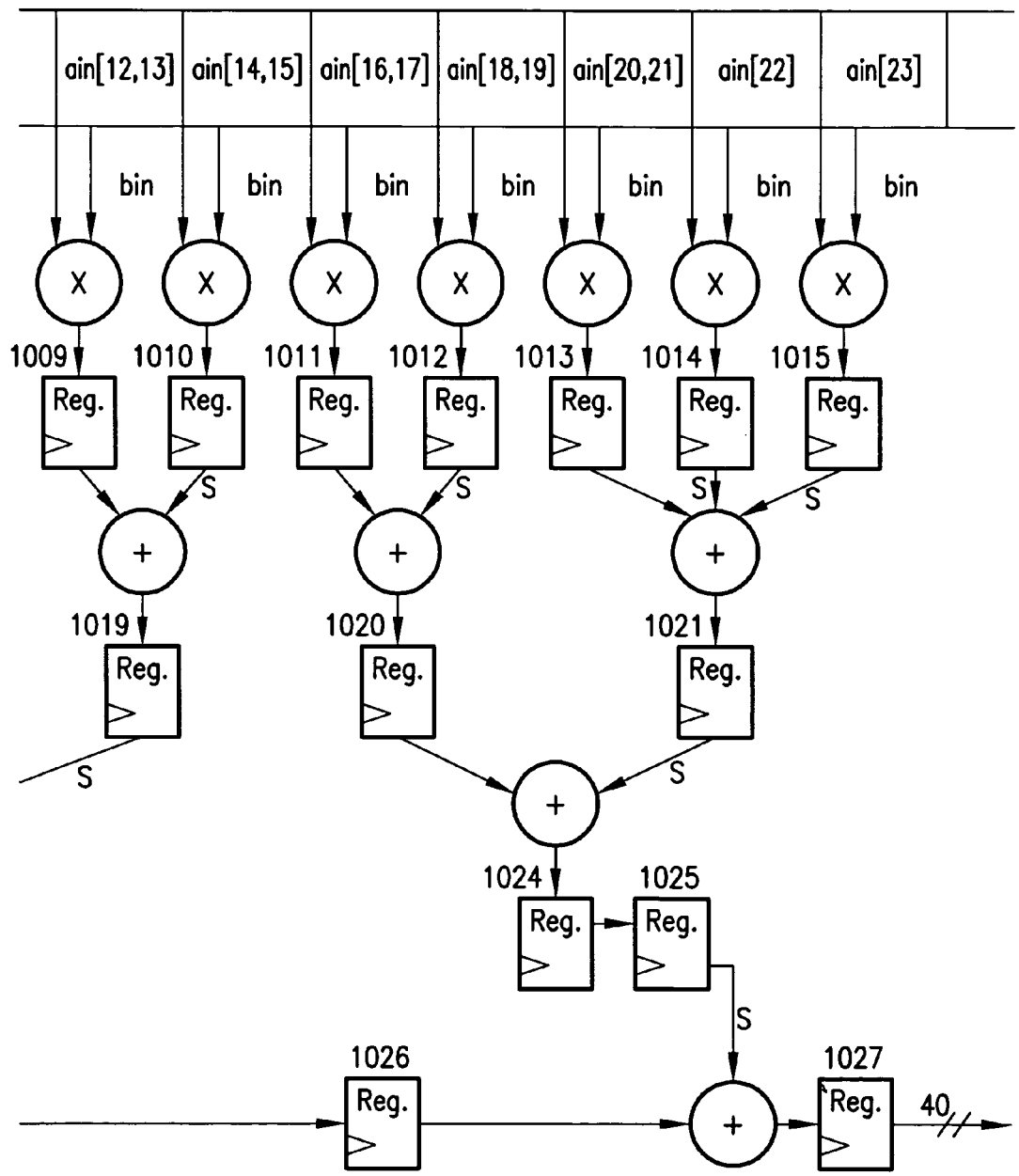

The architecture of the multiplier is shown in FIG. 13. The multiplier as shown here is optimized for the FPGA in terms of speed (in Xilinx Spartan IIE-400 FPGA, speed grade 7, it is able to operate at the frequency of 90.3618 MHz ). The multiplier performs multiplication of a signed 24-bit number by a signed 16-bit number. The multiplier can accept a new entry every clock cycle (i.e. it is a parallel multiplier) and the multiplication is pipelined into 6 clock cycles. A 24-bit input $a_{in}$ is first stored in register 1001. A 16-bit input $b_{in}$ is first stored in register 1002. Partial products of $b_{in}$ and consecutive pairs of bits of $a_{in}$ are then formed and stored in registers 1003 to 1013 as shown in FIG. 13. These partial products are formed by summing $b_{in}$ with $b_{in}$ shifted by 1 (either $b_{in}$ or shifted $b_{in}$ can be replaced by all zeros in case of the multiplication by 0). The multiplication of $b_{in}$ by the most significant bit of $a_{in}$ is performed separately because this partial sum needs to be negated and added to all the other partial products in order to obtain the correct result. This partial sum is stored in register 1015.

Outputs of registers 1003 and 1004 are added in the next step, taking into the account the position of the bits (i.e. the output of register 1004 is shifted left by two bits before being added to an output of register 1003, which is sign extended). A sum of outputs of registers 1003 and 1004 is stored in register 1016. Sum of outputs of registers 1005 and 1006 is formed in the same fashion as are the sums of outputs of registers 1007 and 1008, 1009 and 1010, 1011 and 1012 and the sums are stored in registers 1017, 1018, 1019 and 1020 respectively. Sum of outputs of registers 1013, 1014 and 1015 is stored in register 1021. Sum of outputs from the registers 1016 and 1017 is performed in the next step, where the output of register 1017 is shifted left by four bits before being added to an output of register 1016, which is sign extended. The result of this addition is stored in register 1022. Outputs of registers 1018 and 1019 are summed in the same fashion as are the outputs of the registers 1020 and 1021 and the sums are stored in registers 1022, 1023 and 1024 respectively. Outputs of registers 1022 and 1023 are summed in the next step where the output of register 1023 is shifted left by eight bits before being added to an output of register 1022, which is sign extended. This sum is stored in register 1026. Output of register 1024 is delayed by one clock cycle by passing its content through register 1025; this is done to have the correct signal at the output of register 1025 in the next cycle. Finally output of register 1026 is added to the output of register 1025, where output of register 1025 is shifted left by 16 bits before being added to an output of register 1026, which is sign extended. The result of this last addition of the outputs of registers 1025 and 1026 is the final result and it is stored in register 1027.

The multiplier architecture as described above may not necessarily be the best architecture for an ASIC implementation and needs to be carefully evaluated against other architectures in terms of the area and speed for each implementation platform/technology separately.

A block diagram of an embodiment of the feedback control is shown in FIG. 4. A description of the proposed control is given for the case of one audio channel that has a full-bridge switch-mode converter 100, but the described control strategy is easily applied to the half-bridge switch-mode converter as well.

The power converter operates at the fixed switching frequency. The control consists of the inner loop 80A and the outer loop 80B. Inner loop 80A performs control of $v_1-v_2$, which is an unfiltered (switched) voltage across the load. The outer loop 80B controls the load voltage $v_{load}$.

The inner loop 80A forces an average value of $v_1-v_2$, which is an unfiltered voltage across the speaker, to be equal to its reference value. $v_1$ and $v_2$ are marked in the block diagram in FIG. 4. The reference for the average value of $v_1-v_2$ is made equal to (PW_short$V_{DCBUS}$), where PW_short is the commanded duration of the output PWM pulse (as calculated by the delta sigma quantizer) and $V_{DCBUS}$ is the value of the latest sample of the corresponding DC_bus voltage (positive DC_bus voltage for positive input data and negative DC_bus voltage for negative input data). PW_short is in case of the left channel equal to Pwshort_left, and in case of the right channel equal to Pwshort_right. Pwshort_left and Pwshort_right are calculated by the delta sigma quantizer block in FIG. 5.

In particular, the integral of the error (difference between the average value of $v_1-v_2$ and PW_short$V_{DCBUS}$) is measured over the time interval equal to the integer number of switching periods. This integral of the error is denoted as $V_{switched\_error}$.

PW_left_out, which is the desired pulse width of the output PWM signal (calculated with full 24-bit precision) in n-th switching period, is calculated as a linear function of k+1 latest values of $V_{switched\_error}$, in addition to the separately set 24-bit command value PW_left_cmd:

$$PW\_left\_out(n) = PW\_left\_cmd(n) - \left(\frac{1}{V_{DCBUS}}\right)\sum_{n-k}^{n} A(i) \cdot V_{switched\_error}(i) \quad \text{Equation (4.1)}$$

where A(i) are weight coefficients for each of the previous values of $V_{switched\_error}$. These coefficients are optimized to achieve low THD of the output waveform. $V_{DCBUS}$ in (4.1) is the value of the latest sample of the corresponding DC_bus voltage.

$V_{switched\_error}$ is measured using an operational amplifier 90 and a capacitor 92 that can be discharged on command. It is actually necessary to have two such operational amplifier-capacitor sets to cover all of the periods; the sets then alternate in measuring $V_{switched\_error}$ so that while one capacitor value is red/reset the other set keeps on measuring. The measurement of $V_{switched\_error}$ is performed in the analog instead of digital domain because higher precision can be achieved with the analog domain measurement.

The outer loop 80B calculates the value PW_left_cmd that is an input for the inner loop.

In simple case of regulation of the output voltage, PW_left_cmd in the n-th switching period is:

$$PW\_left\_cmd(n) = PW\_left + K_2 \cdot \left(\frac{1}{V_{DCBUS}}\right)\sum_{n-k}^{n}(i_{CP}(i) - V_{load}(i)) + K_1 \cdot \left(\frac{1}{V_{DCBUS}}\right)(i_{CP}(n) - V_{load}(n))) \quad \text{Equation (4.2)}$$

In (4.2), $V_{load}(i)$ is the average value of the load voltage in the i-th switching period, calculated as a moving average of all the samples of $v_{load}$ taken in the i-th switching period.

After being converted from the analog to the digital domain by A/D converters 94, values of the input DC_bus voltages VDC_bus positive and VDC_bus positive are represented by words $V_{DCbus+}$ and $V_{DCbus-}$ respectively. $V_{DCbus+}$ and $V_{DCbus-}$ are fed to the cross-point estimator block that eventually adjusts its output value PW_left (and PW_right in case of two channels) to regulate against the changes in the input DC_bus voltages. Detailed account of this action is given above.

An alternative approach to compensate for the dead-time/rise-time/fall-time involves storing (in the chip memory) measured values of the error voltage $V_{switched\_error}$ and the corresponding values of $i_{in}$ ($i_{in}$ is input current to the filter as marked in FIG. 4). Since $V_{switched\_error}$ occurs because of the finite fall/rise time and dead time in the power stage, the obtained set of $V_{switched\_error}$ values can be used to adjust upfront the pulse width of the PWM signal and prevent the error voltage from occurring.

A set of four (or more) desired output voltage versus output current characteristics can be stored in the memory and selected automatically depending on the actually detected output voltage/output current ratio (i.e. detected impedance of the loudspeaker, which normally can take any of the following values: 2, 4, 8 or 16 Ohms).

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A circuit for converting from an input serial pulse code modulated (PCM) digital signal to an output pulse width modulated (PWM) digital signal for driving a switching audio amplifier requiring a pulse width modulated input signal, the circuit comprising:

a sample rate converter receiving the input serial PCM digital signal at a first sampling frequency and converting the input serial PCM digital signal to a second serial PCM digital signal at a second frequency if the first sampling frequency is lower than the second frequency;

a digital filter stage for up-sampling the second serial PCM digital signal to a third frequency and converting the second serial PCM digital signal to a parallel digital signal;

a volume control stage receiving the parallel digital signal and generating a volume adjusted parallel digital signal in accordance with a digital volume command control signal;

a digital cross-point estimator stage for calculating a cross-point between the volume adjusted parallel digital signal and a digital ramp signal and generating a parallel digital signal representing a desired pulse width modulation of the switching audio amplifier;

a quantizing stage for quantizing the parallel digital signal representing the desired pulse width modulation into a quantized parallel digital signal representing the pulse width modulation to be applied to the switching audio amplifier; and a PWM generation stage for converting the quantized parallel digital signal into a PWM signal for driving the switching audio amplifier.

2. The circuit of claim 1, further comprising a feedback control stage receiving as an input an output of the switching audio amplifier, the feedback control stage receiving the parallel digital signal from the cross-point estimator stage and adjusting said parallel digital signal from the cross-point estimator stage into a feedback controlled parallel digital signal so that the output of the switching audio amplifier is at a desired level.

3. The circuit of claim 1, wherein the sample rate converter comprises a deserializer stage for converting the input serial PCM digital signal into a deserialized parallel digital signal and a serializer stage for converting the deserialized parallel digital signal back into a serial digital PCM signal at a second higher frequency if the input serial PCM digital signal is less than the second frequency or for maintaining the frequency the same if the input serial PCM digital signal is at the second frequency.

4. The circuit of claim 1, wherein the digital filter stage comprises:

a first digital low pass filter for producing a low pass filtered parallel digital signal from the second serial PCM digital signal;

an up-sampling stage for increasing the sampling frequency of the low pass filtered parallel digital signal and providing an up-sampled filtered parallel digital signal; and a digital interpolation filter for providing an interpolated up-sampled filtered parallel digital signal.

5. The circuit of claim 4, wherein the up-sampling stage comprises first and second up-sampling stages and the interpolation filter comprises first and second interpolation filters with the first up-sampling stage feeding the first interpolation filter and the second up-sampling stage following the first interpolation filter and feeding the second interpolation filter.

6. The circuit of claim 1, wherein the volume control stage comprises a digital multiplier receiving the parallel digital signal from the digital filter stage and a digital volume command signal for producing the volume adjusted parallel digital signal.

7. The circuit of claim 6, further comprising a digital rate of change limiter filter receiving the volume command control signal for implementing a gradual control of the volume to provide said volume adjusted parallel digital signal.

8. The circuit of claim 7, further comprising a truncation stage coupled to the output of said digital multiplier for truncating the volume adjusted parallel digital signal to a preselected number of digital bits.

9. The circuit of claim 1, wherein the digital cross-point estimator stage comprises:

a digital ramp generator for producing a parallel digital ramp signal;

a digital subtraction stage receiving said parallel digital ramp signal and said volume adjusted parallel digital signal for providing a digital output difference signal corresponding to the difference between the parallel digital ramp signal and the volume adjusted parallel digital signal;

a memory for storing the digital output difference signal as a stored difference signal; and a cross-point solver receiving as inputs the digital output difference signal for a current clock period and the stored difference signal for a prior clock period; and for determining when the difference between the stored and current difference signals changes sign, thereby determining the cross-point between the ramp signal and the volume adjusted signal.

10. The circuit of claim 9, wherein the cross-point solver uses linear approximation between the stored and current difference signals to determine the cross-point between the digital ramp and volume adjusted parallel digital signals.

11. The circuit of claim 1, wherein the quantizing stage receives the parallel digital signal representing the desired pulse width modulation and converts it into a reduced bit quantized digital signal representing the pulse width modulation to be applied to the switching audio amplifier.

12. The circuit of claim 1, wherein the PWM generation stage comprises first and second PWM blocks respectively triggered on positive and negative edges of a clock signal, each of said first and second PWM blocks comprising a digital ramp generator and a digital comparator for comparing the digital ramp signal and the quantized parallel digital signal and for producing two pulse width modulated signals for driving two switches of a half bridge of the switching audio amplifier.

13. The circuit of claim 12, wherein the PWM generation stage further comprises a dead time generator stage for ensuring a dead time between the two pulse width modulated signals for driving the two switches of a half bridge of the switching audio amplifier.

14. The circuit of claim 2, further comprising an output filter coupling the switching audio amplifier to a load, and wherein the feedback control stage comprises:

an inner control loop and an outer control loop, the inner control loop controlling an average value of the voltage of the output of the switching audio amplifier prior to filtering by the output filter and the outer control loop controlling the voltage of the output of the switching audio amplifier after filtering by the output filter.

15. The circuit of claim 14, wherein the inner control loop further provides compensation for dead time and finite turn off times of switches of the audio switching amplifier.

16. The circuit of claim 14, wherein the outer control loop further provides compensation for losses in the output filter and switching audio amplifier.

17. A circuit for converting from an input serial pulse code modulated (PCM) digital signal to an output pulse width modulated (PWM) digital signal for driving a switching circuit requiring a pulse width modulated input signal, the circuit comprising:

a digital filter stage for up-sampling the input serial PCM digital signal to a higher frequency and converting the input serial PCM digital signal to a parallel digital signal;

a digital cross-point estimator stage for calculating a cross-point between the parallel digital signal and a digital ramp signal and generating a parallel digital signal representing a desired pulse width modulation of the switching circuit; and a PWM generation stage for converting the parallel digital signal, representing the desired pulse width modulation of the switching circuit into a PWM signal for driving the switching circuit.

18. The circuit of claim 17, further comprising a sample rate converter receiving the input serial PCM digital signal at a first sampling frequency and converting the input serial PCM digital signal to a second serial PCM digital signal at a second frequency if the first sampling frequency is lower than the second frequency and providing the second serial PCM digital signal at the second frequency to the digital filter stage.

19. The circuit of claim 17, further comprising a gain control stage receiving the parallel digital signal from the digital filter stage and generating a gain adjusted parallel digital signal in accordance with a digital gain command control signal.

20. The circuit of claim 17, further comprising a quantizing stage for quantizing the parallel digital signal representing the desired pulse width modulation into a quantized parallel digital signal representing the pulse width modulation to be applied to the switching circuit.

21. The circuit of claim 17, further comprising a feedback control stage receiving as an input an output of the switching circuit, the feedback control stage receiving the parallel digital signal from the cross-point estimator stage and adjusting said parallel digital signal from the cross-point estimator stage into a feedback controlled parallel digital signal so that the output of the switching circuit is at a desired level.

22. The circuit of claim 18, wherein the sample rate converter comprises a deserializer stage for converting the input serial PCM digital signal into a deserialized parallel digital signal and a serializer stage for converting the deserialized parallel digital signal back into a serial digital PCM signal at a second higher frequency if the input serial PCM digital signal is less than the second frequency or for maintaining the frequency the same if the input serial PCM digital signal is at the second frequency.

23. The circuit of claim 18, wherein the digital filter stage comprises:

a first digital low pass filter for producing a low pass filtered parallel digital signal from the second serial PCM digital signal;

an up-sampling stage for increasing the sampling frequency of the low pass filtered parallel digital signal and providing an up-sampled filtered parallel digital signal; and a digital interpolation filter for providing an interpolated up-sampled filtered parallel digital signal.

24. The circuit of claim 23, wherein the up-sampling stage comprises first and second up-sampling stages and the interpolation filter comprises first and second interpolation filters with the first up-sampling stage feeding the first interpolation filter and the second up-sampling stage following the first interpolation filter and feeding the second interpolation filter.

25. The circuit of claim 19, wherein the gain control stage comprises a digital multiplier receiving the parallel digital signal from the digital filter stage and a digital gain command signal for producing the gain adjusted parallel digital signal.

26. The circuit of claim 25, further comprising a digital rate of change limiter filter receiving the gain command control signal for implementing a gradual control of the gain to provide said gain adjusted parallel digital signal.

27. The circuit of claim 26, further comprising a truncation stage coupled to the output of said digital multiplier for truncating the gain adjusted parallel digital signal to a preselected number of digital bits.

28. The circuit of claim 19, wherein the digital cross-point estimator stage comprises:

a digital ramp generator for producing a parallel digital ramp signal;

a digital subtraction stage receiving said parallel digital ramp signal and said gain adjusted parallel digital signal for providing a digital output difference signal corresponding to the difference between the parallel digital ramp signal and the gain adjusted parallel digital signal;

a memory for storing the digital output difference signal as a stored difference signal; and a cross-point solver receiving as inputs the digital output difference signal for a current clock period and the stored difference signal for a prior clock period; and for determining when the difference between the stored and current difference signals changes sign, thereby determining the cross-point between the ramp signal and the gain adjusted signal.

29. The circuit of claim 28, wherein the cross-point solver uses linear approximation between the stored and current difference signals to determine the cross-point between the digital ramp and gain adjusted parallel digital signals.

30. The circuit of claim 20, wherein the quantizing stage receives the parallel digital signal representing the desired pulse width modulation and converts it into a reduced bit quantized digital signal representing the pulse width modulation to be applied to the switching circuit.

31. The circuit of claim 17, wherein the PWM generation stage comprises first and second PWM blocks respectively triggered on positive and negative edges of a clock signal, each of said first and second PWM blocks comprising a digital ramp generator and a digital comparator for comparing the digital ramp signal and the parallel digital signal representing the desired pulse width modulation of the switching circuit and for producing two pulse width modulated signals for driving two switches of a half bridge of the switching circuit.

32. The circuit of claim 31, wherein the PWM generation stage further comprises a dead time generator stage for ensuring a dead time between the two pulse width modulated signals for driving the two switches of a half bridge of the switching circuit.

33. The circuit of claim 21, further comprising an output filter coupling the switching circuit to a load, and the feedback control stage comprises:

an inner control loop and an outer control loop, the inner control loop controlling an average value of the voltage of the output of the switching circuit prior to filtering by the output filter and the outer control loop controlling the voltage of the output of the switching circuit after filtering by the output filter.

34. The circuit of claim 33, wherein the inner control loop further provides compensation for dead time and finite turn off times of switches of the switching circuit.

35. The circuit of claim 33, wherein the outer control loop further provides compensation for losses in the output filter and switching circuit.

36. A method for converting from an input serial pulse code modulated (PCM) digital signal to an output pulse width modulated (PWM) digital signal for driving a switching circuit requiring a pulse width modulated input signal, the method comprising:

up-sampling the input serial PCM digital signal to a higher frequency and converting the input serial PCM digital signal to a parallel digital signal;

calculating a cross-point between the parallel digital signal and a digital ramp signal and generating a parallel digital signal representing a desired pulse width modulation of the switching circuit; and converting the parallel digital signal, representing the desired pulse width modulation of the switching circuit into a PWM signal for driving the switching circuit.

37. The method of claim 36, further comprising receiving the input serial PCM digital signal at a first sampling frequency and converting the input serial PCM digital signal to a second serial PCM digital signal at a second frequency if the first sampling frequency is lower than the second frequency and providing the second serial PCM digital signal at the second frequency for up-sampling.

38. The method of claim 36, further comprising receiving the parallel digital signal and generating a gain adjusted parallel digital signal in accordance with a digital gain command control signal.

39. The method of claim 36, further comprising quantizing the parallel digital signal representing the desired pulse width modulation into a quantized parallel digital signal representing the pulse width modulation to be applied to the switching circuit.

40. The method of claim 36, further comprising receiving as a feedback input an output of the switching circuit and adjusting said parallel digital signal into a feedback controlled parallel digital signal so that the output of the switching circuit is at a desired level.

41. The method of claim 37, further comprising converting the input serial PCM digital signal into a deserialized parallel digital signal and subsequently converting the deserialized parallel digital signal back into a serial digital PCM signal at a second higher frequency if the input serial PCM digital signal is less than the second frequency or maintaining the frequency the same if the input serial PCM digital signal is at the second frequency.

42. The method of claim 37, further comprising:
producing a low pass filtered parallel digital signal from the second serial PCM digital signal;
up-sampling the low pass filtered parallel digital signal and providing an up-sampled filtered parallel digital signal; and
providing an interpolated up-sampled filtered parallel digital signal.

43. The method of claim 42, wherein the step of up-sampling comprises up-sampling the low pass filtered parallel digital signal a first time and then interpolating the up-sampled low pass filtered parallel digital signal and then up-sampling a second time and then interpolating a second time.

44. The method of claim 38, wherein the step of generating a gain adjusted parallel digital signal comprises receiving the parallel digital signal and multiplying by a digital gain command signal for producing the gain adjusted parallel digital signal.

45. The method of claim 44, further comprising receiving the gain command control signal and using a digital rate of change limiter to implement a gradual control of the gain to provide said gain adjusted parallel digital signal.

46. The method of claim 45, further comprising truncating the gain adjusted parallel digital signal to a preselected number of digital bits.

47. The method of claim 38, wherein the step of calculating a cross-point comprises:
producing a parallel digital ramp signal;
receiving said parallel digital ramp signal and said gain adjusted parallel digital signal and providing a digital output difference signal corresponding to the difference between the parallel digital ramp signal and the gain adjusted parallel digital signal;
storing the digital output difference signal as a stored difference signal; and
receiving as inputs the digital output difference signal for a current clock period and the stored difference signal for a prior clock period; and determining when the difference between the stored and current difference signals changes sign, thereby determining the cross-point between the ramp signal and the gain adjusted signal.

48. The method of claim 47, wherein the step of determining the cross-point comprises using a linear approximation between the stored and current difference signals to determine the cross-point between the digital ramp and gain adjusted parallel digital signals.

49. The method of claim 39, wherein the step of quantizing comprises receiving the parallel digital signal representing the desired pulse width modulation and converting it into a reduced bit quantized digital signal representing the pulse width modulation to be applied to the switching circuit.

50. The method of claim 36, wherein the step of converting into a PWM signal comprises providing a digital ramp signal and comparing the digital ramp signal and the parallel digital signal representing the desired pulse width modulation of the switching circuit and producing two pulse width modulated signals for driving two switches of a half bridge of the switching circuit.

51. The method of claim 50, further comprising ensuring a dead time between the two pulse width modulated signals for driving the two switches of a half bridge of the switching circuit.

52. The method of claim 40, further comprising filtering an output signal from the switching circuit provided to a load, and further comprising:
providing an inner and an outer feedback control loop; and
controlling with the inner feedback control loop an average value of the voltage of the output of the switching circuit prior to filtering the output signal and controlling with the outer feedback control loop the voltage of the output of the switching circuit after filtering the output signal.

53. The method of claim 52, further comprising providing in the inner feedback control loop compensation for dead time and finite turn off times of switches of the switching circuit.

54. The method of claim 52, further comprising providing in the outer feedback control loop compensation for losses in the output filter and switching circuit.

* * * * *